US011405033B2

(12) United States Patent
Xie et al.

(10) Patent No.: US 11,405,033 B2
(45) Date of Patent: Aug. 2, 2022

(54) METHODS, APPARATUS, AND SYSTEMS TO DRIVE A TRANSISTOR

(71) Applicant: TEXAS INSTRUMENTS INCORPORATED, Dallas, TX (US)

(72) Inventors: Yong Xie, Plano, TX (US); Michael Lüeders, Freising (DE); Cetin Kaya, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/322,018

(22) Filed: May 17, 2021

(65) Prior Publication Data

US 2021/0297075 A1    Sep. 23, 2021

Related U.S. Application Data

(62) Division of application No. 16/827,357, filed on Mar. 23, 2020, now Pat. No. 11,038,502.

(51) Int. Cl.
| | |
|---|---|
| *H03K 3/00* | (2006.01) |
| *H03K 17/284* | (2006.01) |
| *H02M 1/08* | (2006.01) |
| *G05F 1/56* | (2006.01) |

(52) U.S. Cl.
CPC ............. *H03K 17/284* (2013.01); *G05F 1/56* (2013.01); *H02M 1/08* (2013.01)

(58) Field of Classification Search
CPC ........... H03K 17/284; H03K 17/08122; H03K 17/163; G05F 1/56; H02M 1/08; H02M 3/158

USPC .......................................................... 327/108
See application file for complete search history.

(56) References Cited

U.S. PATENT DOCUMENTS

| | | | |
|---|---|---|---|
| 5,546,043 A | 8/1996 | Ichioka et al. | |
| 5,625,312 A * | 4/1997 | Kawakami | ........... H03K 17/163 327/483 |
| 7,254,002 B2 | 8/2007 | Aemireddy | |
| 7,646,115 B2 * | 1/2010 | Illegems | ................... G05F 1/56 307/80 |
| 10,511,263 B2 | 12/2019 | Hoyerby | |
| 11,038,502 B1 * | 6/2021 | Xie | .................. H03K 17/08122 |
| 2001/0047220 A1 * | 11/2001 | Niimi | ................. H03K 17/6877 700/170 |
| 2014/0139268 A1 * | 5/2014 | Bayerer | ............... H03K 17/063 327/109 |

(Continued)

OTHER PUBLICATIONS

PCT International Search Report for Pat. Appln. No. 2021023560, dated Jul. 1, 2021.

*Primary Examiner* — Ryan Jager
(74) *Attorney, Agent, or Firm* — Mark A. Valetti; Charles A. Brill; Frank D. Cimino

(57) ABSTRACT

Methods, apparatus, and systems are disclosed to drive a transistor. An example apparatus includes a regulator including a first input terminal adapted to be coupled to a control terminal of a transistor, a first output terminal, and a second output terminal, a first stage including a first input terminal coupled to the first output terminal of the regulator and an output terminal adapted to be coupled to the control terminal of the transistor, and a second stage including an input terminal coupled to the second output terminal of the regulator, and an output terminal adapted to be coupled to the control terminal of the transistor.

7 Claims, 15 Drawing Sheets

(56) References Cited

U.S. PATENT DOCUMENTS

2021/0297075 A1* 9/2021 Xie ................. H03K 17/08122

* cited by examiner

METHODS, APPARATUS, AND SYSTEMS TO DRIVE A TRANSISTOR

CROSS-REFERENCE TO RELATED APPLICATION

This patent application is a divisional of U.S. patent application Ser. No. 16/827,357, filed Mar. 23, 2020, which is incorporated herein by reference in its entirety.

FIELD OF THE DISCLOSURE

This disclosure relates generally to transistors, and, more particularly, to methods, apparatus, and systems to drive a transistor.

BACKGROUND

In certain applications, a transistor, such as a field-effect transistor (FET) or metal-oxide-semiconductor field-effect transistor (MOSFET), is connected to a load through an inductor. The transistor may be controlled to provide current to a load using pulse width modulation (PWM) signals provided to a gate of the transistor.

DETAILED DESCRIPTION

Figure 1:
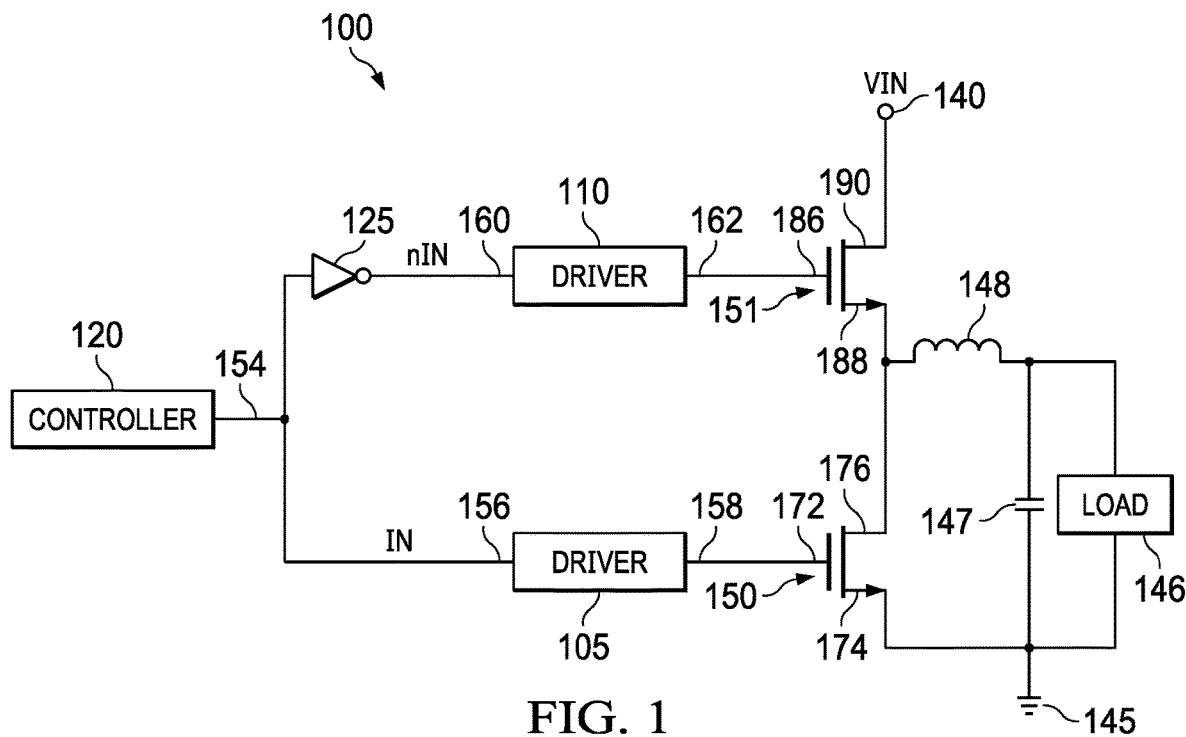
FIG. 1 is a schematic illustration of an example power converter including a first example driver and a second example driver.

The figures are not to scale. In general, the same reference numbers will be used throughout the drawing(s) and accompanying written description to refer to the same or like parts. As used herein, references to connections (e.g., attached, coupled, connected, and joined) are to be construed in light of the specification and, when pertinent, the surrounding claim language. Construction of connection references in the present application shall be consistent with the claim language and the context of the specification which describes the purpose for which various elements are connected. As such, connection references do not necessarily infer that two elements are directly connected and in fixed relation to each other.

Descriptors first, second, third, etc., are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

Some examples discussed herein include methods, apparatus, and systems to drive a transistor with a controlled slew rate. Transistors are utilized in, for example, power conversion circuits, electrical or power adapters, electric vehicle charging units, and electric vehicle components (e.g., battery charging circuits, traction inverters, etc.). A signal (e.g., a voltage and/or a current) may be applied to a transistor gate (e.g., a control terminal) to enable another signal to pass through another pair of transistor terminals (e.g., from a source terminal to a drain terminal of the transistor). Power conversion circuits, or power converters, are used in applications that may benefit from a reliable power source. A power converter may be a step-up converter (e.g., a boost converter that creates an output voltage greater than the input voltage), a step-down converter (e.g., a buck converter that creates an output voltage less than the input voltage), etc., and/or a combination thereof.

In order for a power converter to be an efficient and reliable power source, the current or currents flowing through various parts of the power converter circuit (e.g., the inductor current, transistor current, load current, etc.) are regulated by a controller to turn a switch on and/or off. The controller monitors these currents to regulate the output voltage, thus providing a reliable power source. For example, a controller may regulate a load current by regulating current through an inductor to ensure that the output voltage is within a desired range. The controller regulates the current through the inductor, and thus regulates the output voltage, by varying the operation of the transistors.

Transistors may be controlled by a driver (e.g., a driver circuit). A driver or driver circuit may enable (e.g., turn on) and disable (e.g., turn off) a transistor responsive to a PWM signal generated by a controller (e.g., a control circuit). Examples of drivers (e.g., driver circuits), as discussed herein, include one or more transistors such as FETs, MOSFETs, or any other switching devices such as bipolar junction transistors (BJTs). However, other switch types or technologies may be used.

Drivers may be configured by a controller to enable and disable transistors. The power conversion circuit including such driver(s) may switch between high-side control (e.g., enabling a first transistor and disabling a second transistor) using a first driver and low-side control (e.g., disabling the first transistor and enabling the second transistor) using a second driver to provide a substantially stable or otherwise regulated output voltage.

In some applications (e.g., a power conversion circuit, a power conversion system, etc.), a voltage (e.g., a gate voltage) at a gate of a transistor may not exceed a voltage threshold while remaining in an on-state (e.g., linear mode) for an extended period of time to ensure a reliable operation of the transistor. A transistor may exceed normal operation conditions as the gate voltage surpasses a normal operating voltage (e.g., six volts, seven volts, etc.) for a short period of time. A transistor operating under normal operating conditions can have a certain slew rate. As used herein, the phrase "slew rate," and variations thereof, encompass a change in an electrical quantity of a signal (e.g., voltage or current) per unit of time. For example, when a transistor is enabled by a driver, the change in voltage at the drain terminal of the transistor has a slew rate (e.g., twenty volts per nanosecond, 100 volts per nanosecond, etc.). The slew rate of a transistor can govern a speed at which a signal at a transistor terminal varies to a desired value (e.g., a speed at which the transistor is enabled and begins conducting).

A slew rate of a transistor may be influenced by a signal (e.g., a current, a voltage, etc.) provided to a control terminal of the transistor. For example, a higher current at the gate of the transistor may correspond to a higher slew rate of the transistor, and a higher slew rate may correspond to a faster variation of a signal at a terminal of the transistor. Therefore, applications such as power converter circuitry may benefit from a relatively fast, controlled slew rate of a transistor. In some examples, a transistor with a maximum-rated voltage (e.g., six volts, seven volts, etc.) may transition from an off-state (e.g., a cut-off mode where no signal flows between two transistor terminals) to an on-state (e.g., a linear mode where signal flows between the two terminals) using a signal that exceeds the maximum rated voltage. Because the signal to activate the transistor exceeds the maximum rated voltage while the transistor transitions into the on-state, the slew rate of the signal at the two terminals may be controlled to a greater degree. For example, if a transistor includes a maximum rated voltage of six volts, and a signal of twelve volts is applied to the transistor gate until the transistor reaches the linear mode, the slew rate of the transistor may be greater than the slew rate of a transistor enabled with a signal of six volts. In some examples, because the control terminal of the transistor is driven (such as the driver holding the gate terminal of the transistor at a voltage) above the rated voltage for a relatively short period of time (such as tens of nanoseconds) to drive the transistor over the transition period, the transistor may not degrade and/or experience a reduction in reliability. Further, the voltage at the transistor gate may be regulated (e.g., maintained between six and twelve volts, held at a clamp voltage of eight volts, etc.) to enable a higher slew rate of the transistor and prevent damage to the transistor that may be caused by enabling the transistor sourced by a voltage source of twelve volts.

Some examples discussed herein include transistors produced using Gallium Nitride (GaN). Additionally, some examples discussed herein include using GaN transistors and include methods, apparatus, and systems to drive a transistor with a controlled slew rate. Some examples discussed herein include the ability to drive a transistor (such as at a transistor gate) using a current to set the slew rate of the transistor, and the slew rate may be enabled by a headroom (such as a voltage at the gate terminal of twelve volts) higher than an on-state headroom (such as a maximum rated voltage at the gate terminal of six volts) to prevent damage to the transistor. Some examples discussed herein include driving the terminal gate with a constant current source based on a voltage level that exceeds the normal operating voltage level while the transistor is in the on-state. Some examples discussed herein include clamping (such as regulating) the higher gate signal during a transition of the transistor into an on-state to protect the transistor from stress. For example, a driver may include a regulator to enable and/or disable a control signal (such as a current signal) provided to the gate terminal responsive to a voltage at the gate terminal exceeding a clamp voltage (such as eight volts). Some examples discussed herein include a relatively weak pull-up transistor to hold the gate signal of the transistor at the maximum rated voltage (such as six volts) to prevent stress on the transistor after the transistor has been enabled by a current source. In some examples discussed herein, the gate drive current and/or the current provided to the gate of the terminal by a driver is programmable over a wide range.

In some examples, a regulator may provide a first trigger signal to a first stage in a driver to enable a transistor at a current provided by a first voltage source node. Responsive to a signal at the control terminal of the transistor exceeding a threshold voltage value, the regulator may disable the first stage after an amount of delay and provide a second trigger signal to a second stage in the driver to enable the transistor (e.g., remain in the on-state) at a current provided by a second voltage source node. The first voltage source node may include a greater potential (e.g., an electric potential, twelve volts, etc.) than the electric potential of the second voltage source node (e.g., six volts, seven volts, etc.).

FIG. 1 is a schematic illustration of an example power converter 100 including a first example driver 105 and a second example driver 110. The power converter 100 includes the first driver 105, the second driver 110, a controller 120, and an inverter 125. The power converter 100 is adapted to be coupled to an example bus voltage node 140, an example ground node 145, and an example load 146. In the topology of FIG. 1, the power converter 100 is adapted and/or otherwise configured to drive (e.g., power and/or provide an output signal to) the load 146. For example, the load 146 can correspond to an electric vehicle, one or more batteries in the electric vehicle, an electronic control unit (ECU), an electric motor in the electric vehicle, a traction inverter included in the electric vehicle, etc., and/or a combination thereof. The power converter 100 includes an example capacitor 147, an example inductor 148, a first example transistor 150, and a second example transistor 151.

The controller 120 has an output coupled to an example output terminal 154. The first driver 105 has a first input coupled to an example input terminal 156. The input terminal 156 is coupled to the output terminal 154 in a configuration to obtain an activation signal (IN) from the controller 120. The first driver 105 has a first output coupled to an example output terminal 158. The second driver 110 has a second input coupled to an example input terminal 160. The input terminal 160 is coupled to an output of the inverter 125 in a configuration to obtain an inverted activation signal (nIN). The second driver 110 has a second output coupled to an example output terminal 162. The first transistor 150 has a control terminal 172 (e.g., a gate terminal) coupled to the output terminal 158 to transition into an on-state responsive to obtaining one or more control signals from the first driver 105, a source terminal 174 (e.g., a first current terminal) coupled to the ground node 145, and a drain terminal 176 (e.g., a second current terminal) coupled to the inductor 148. The second transistor 151 has a control terminal 186 coupled to the output terminal 162 of the second driver 110, a source terminal 188 coupled to the inductor 148, and a drain terminal 190 coupled to the bus voltage node 140. In the topology of FIG. 1, the bus voltage node 140 provides a voltage signal (such as the signal VIN).

The inverter 125 is coupled between the output terminal 154 and the input terminal 160 of the second driver 110. The inductor 148 is coupled to the source terminal 188 of the second transistor 151 and to the drain terminal 176 of the first transistor 150. The capacitor 147 is coupled between the inductor 148 and the ground node 145. The load 146 (e.g., an electronic device to be powered, industrial end equipment, etc.) is coupled between the inductor 148 and the ground node 145.

In the example of FIG. 1, the first driver 105 controls the conduction state (e.g., conducting or not conducting) of the first transistor 150, and the second driver 110 controls the conduction state of the second transistor 151. However, the drivers 105, 110 may control the conduction state of any number of transistors or switches. Further, any number of drivers may control the conduction state of a transistor. For example, the first driver 105 can transition the first transistor 150 from a non-conducting state into a conducting state, and a second driver can be coupled to the control terminal 172 to transition the first transistor 150 from a conducting state into a non-conducting state.

The first transistor 150 is an n-channel metal-oxide semiconductor (NMOS) field-effect transistor. Alternatively, the first transistor 150 may be a p-channel metal-oxide-semiconductor (PMOS) field-effect transistor, bipolar junction transistor (BJT), or any other three-terminal device. Similarly, the second transistor 151 is an NMOS field-effect transistor. Alternatively, the second transistor 151 may be a PMOS field-effect transistor, BJT, or any other three-terminal device. As used herein, the phrase "NMOS transistor," and variations thereof, encompass an NMOS field-effect transistor (FET), a GaN transistor, a silicon carbide (SiC) transistor, etc. Similarly, as used herein, the phrase "PMOS transistor," and variations thereof, encompass a PMOS field-effect transistor, a GaN transistor, an SiC transistor, etc.

In operation, the controller 120 generates an activation signal (e.g., a PWM signal, a voltage signal IN, etc.) at the output terminal 154. The controller 120 regulates the load voltage of the power converter at the load 146. In some examples, the controller 120 regulates the load voltage to maintain a maximum allowable voltage or a minimum allowable voltage, regulate the load current, and/or limit the maximum positive current and/or the minimum negative current of the inductor 148 to avoid damage to the load 146 and/or, more generally, the power converter 100. Additionally, the controller 120 controls the conduction states (e.g., conducting or not conducting) of the first transistor 150 and the second transistor 151 by providing the activation signal (IN) to the drivers 105, 110. The controller 120 can be implemented using a hardware-implemented state machine, a microcontroller, a plurality of discrete components, or any other suitable device.

The inverter 125 responds to variations of the control signal provided by the controller 120 and generates an inverted signal (e.g., the voltage signal nIN). As used herein, an inverter (e.g., the inverter 125) includes control circuitry to respond to the activation signal and provide (e.g., output) an inverted signal to the second driver 110. For example, if the controller 120 generates an activation signal (IN) voltage of five volts at the input terminal of the inverter 125, the inverter 125 may provide an activation signal (nIN) voltage of zero volts to the second driver 110.

In some examples, other components, such as level-shifting circuitry or digital buffers, can be coupled to the output terminal 154 of the controller 120 and/or to the input terminals of the first driver 105 or the second driver 110. For example, level shifting circuitry can be coupled to the output terminal 154 of the controller 120 to shift the voltage of the control signal (such as the signal IN) to a higher voltage amplitude. In some examples, the inverter 125 may additionally or alternatively be coupled to the input terminal 156 of the first driver 105.

Any other method to provide signals (e.g., an activation signal, the signal IN, etc.) at the input terminal 156 of the first driver 105 and/or at the input terminal 160 of the second driver 110 may additionally or alternatively be used. For example, the controller 120 can include control circuitry (such as an inverter) to create activation signals (such as the signal IN or the signal nIN), and the controller 120 may include a first output terminal to be coupled to the input terminal 156 and a second output terminal to be coupled to the input terminal 160.

In some examples discussed herein, the first driver 105 and the second driver 110 respond to variations in the activation signal (IN) generated by the controller 120 to enable and/or disable a transistor (such as the first transistor 150 or the second transistor 151). In some examples, the second driver 110 enables the second transistor 151 as the first driver 105 disables the first transistor 150, and the first driver 105 enables the first transistor 150 as the second driver 110 disables the second transistor 151. The drivers 105, 110 can be configured to enable and/or disable the transistors 150, 151 to regulate a power signal (e.g., a current through the inductor 148) provided to the load 146.

The first driver 105 responds to variations in the activation signal obtained at the input terminal 156 by providing at least one control signal to the first transistor 150. In some examples discussed herein, the first driver 105 provides (e.g., delivers, outputs, transmits, etc.) a first control signal to transition the first transistor 150 from a non-conducting state into a conducting state and a second control signal for the first transistor 150 to remain in the conducting state. Similarly, the second driver 110 responds to variations in the activation signal modified by the inverter 125 (e.g., the signal nIN) by providing at least one control signal to the second transistor 151.

In some examples, the first driver 105 and/or the second driver 110 include a first stage and a second stage driven by different voltage levels to enable the transistors 150, 151. For example, the first driver 105 can include a first stage adapted to be coupled to a twelve volt source and a second stage adapted to be coupled to a six volt source. The first driver 105 can include a regulator to enable the first stage, and the first stage can provide a gate drive current to the control terminal 172 sourced by the twelve volt source. The regulator may then disable the first stage and enable the second stage, and the second stage may provide a gate drive current to the control terminal 172 sourced by the six volt source. Any number of control signals may additionally or alternatively be provided by either of the drivers 105, 110 to either of the transistors 150, 151. For example, the first driver 105 can provide a third control signal to the first transistor 150 to transition the first transistor 150 from a conducting state to a non-conducting state.

In the illustrated example of FIG. 1, the first driver 105 responds to the activation signal exceeding a threshold voltage level (such as a logic high level, a voltage corresponding to a logic "1," etc.) by enabling the first transistor 150. In some examples, the first driver 105 disables the first transistor 150 when the signal IN does not exceed the threshold voltage level. Similarly, the second driver 110 responds to variations in the signal at the input terminal 160. The second driver 110 responds to the signal provided by the inverter 125 by enabling the second transistor 151 responsive to the signal nIN exceeding a threshold voltage level. In some examples, the second driver 110 disables the second transistor 151 when the signal nIN does not exceed the threshold voltage level. In some examples, the power converter 100 can include more than two drivers and/or more than two transistors to regulate the power signal provided to the load 146.

The ground node 145 provides a reference voltage (e.g., zero volts) for the power converter 100. In some examples, the ground node 145 can be coupled to earth ground, digital ground, or analog ground. In other examples, the ground node 145 can be coupled to a source node voltage to provide a reference voltage (such as one volt).

The inductor 148 is a two-terminal electrical component that stores energy in a magnetic field when current flows through it. During high-stage operation, when the second transistor 151 is conducting (e.g., enabled) and the first transistor 150 is not conducting (e.g., disabled), energy is stored in the inductor 148. During low-stage operation, when the first transistor 150 is conducting and the second transistor 151 is not conducting, energy is being discharged from the inductor 148 through the first transistor 150 to ground.

The capacitor 147 is a two-terminal electrical component that stores energy in an electric field. During high-stage operation, when the second transistor 151 is conducting and the first transistor 150 is not conducting, energy is being stored in the capacitor 147. During low-stage operation (e.g., the first transistor 150 is conducting), energy is discharged from the capacitor 147 to the load 146.

Figure 2:
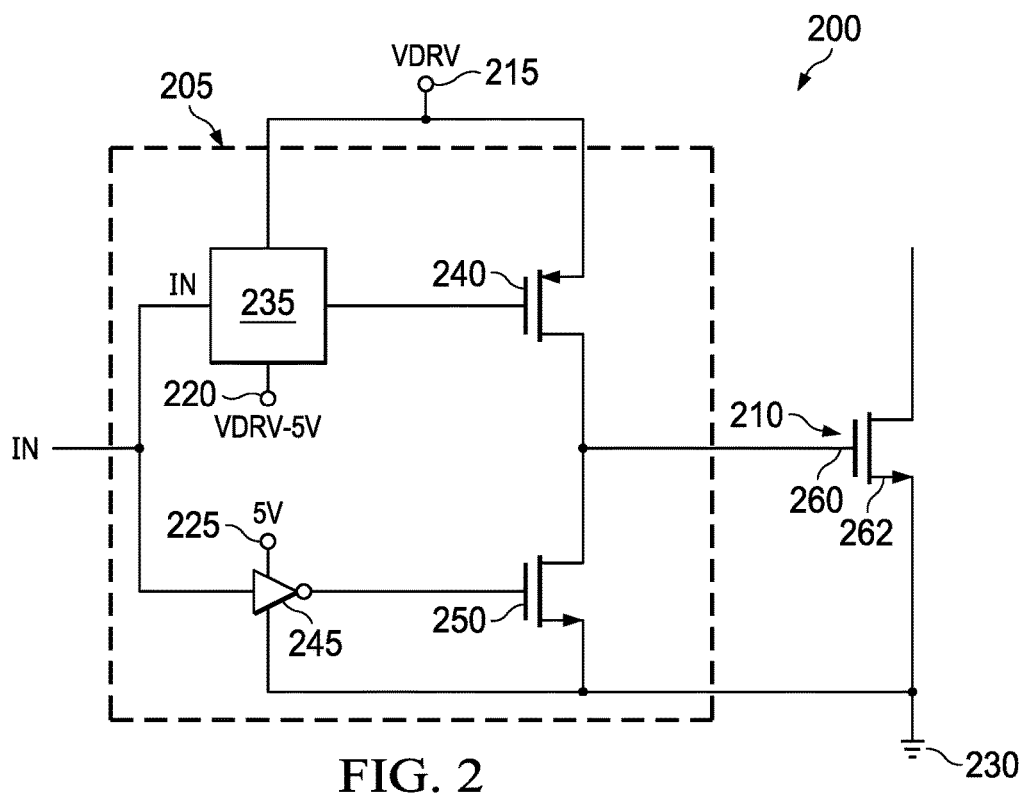
FIG. 2 is a first schematic illustration of a first driver of a power converter.

FIG. 2 is a first schematic illustration 200 of a driver 205 in a power converter. The first schematic illustration 200 includes the driver 205, a first transistor 210, a first voltage source node 215, a second voltage source node 220, a third voltage source node 225, and a ground node 230. The driver 205 includes an inverting level shifter 235, a second transistor 240, an inverter driver 245, and a third transistor 250. The first transistor 210 is an NMOS transistor, the second transistor 240 is a PMOS transistor, and the third transistor 250 is an NMOS transistor. The first transistor includes a control terminal 260 and a source terminal 262. The source terminal 262 is coupled to the ground node 230.

The inverter driver 245 inverts the signal IN and delivers the inverted voltage signal to the second transistor 240. The inverter driver 245 provides a signal of zero volts when the voltage of the signal IN is five volts. The inverter driver 245 provides a signal of five volts when the voltage of the signal IN. The inverter driver 245 enables and disables the third transistor 250 responsive to variations in the signal IN.

During an on-state (e.g., the signal IN has a voltage of five volts), the second transistor 240 is enabled (e.g., conducting) and the third transistor 250 is disabled (e.g., non-conducting). As a result, the first transistor 210 is enabled during the on-state. During an off-state (e.g., the signal IN has a voltage of zero volts), the second transistor 240 is disabled and the third transistor 250 is enabled. As a result, the first transistor 210 is disabled during the off-state.

The driver 205 of FIG. 2 is configured to deliver a control signal to the first transistor 210 sourced by the first voltage source node 215 (e.g., sourced by a voltage of VDRV, a voltage of six volts). Further, in the circuit of FIG. 2, the PMOS pull-up (e.g., the second transistor 240) has a large, and therefore inefficient, die area. Because the driver 205 is powered with VDRV (e.g., six volts), the gate of the first transistor 210 (e.g., the voltage at the control terminal 260) reaches a maximum voltage of VDRV (e.g., six volts).

An example equation to calculate the headroom when driving a transistor is shown below in Equation 1:

$$\text{HEADROOM} = VDRV - V_{gs} \quad \text{Equation 1}$$

In the example of Equation 1, HEADROOM represents a headroom of (e.g., a threshold voltage at) a control terminal (such as the control terminal 260) at which a transistor (such as the transistor 210) has a limited slew rate, VDRV represents the voltage of the first voltage source node 215 (such as VDRV, six volts, etc.), and $V_{gs}$ represents a difference between the voltage at a gate terminal (such as the control terminal 260) and the voltage at a source terminal (such as the source terminal 262). As used herein and shown above in Equation 1, the phrase "headroom of a transistor," or variations thereof, encompasses a difference between (1) a voltage driving the transistor (e.g., VDRV) and (2) the difference between the gate terminal voltage and the source terminal voltage. In some examples, a larger voltage driving a transistor, such as at twelve volts compared to six volts, enables a larger headroom of the transistor, and thus enable the transistor to turn on with a greater slew rate. In some examples, the headroom of a transistor controls a current (e.g., a gate current, a gate drive current, an output current, etc.) that the driver may provide when driving (e.g., transitioning) a transistor into an enabled state. Thus, the headroom of the driver controls the slew rate of the transistor as it transitions into an enabled stage. In some examples, such as those discussed below in connection with FIGS. 5-8, a first transistor may be enabled by a first voltage source (such as twelve volts) at the control terminal, and a second transistor may be enabled by a second voltage source (such as six volts) at the control terminal. Because the first transistor is powered at the control terminal by a first voltage source with a greater electric potential than the second transistor, the first transistor includes a headroom greater than that of the second transistor. Thus, the slew rate of the first transistor may be greater than that of the second transistor while transitioning into the enabled state.

In the example of FIG. 2, the driver 205 provides a control signal (such as a current signal) to the transistor 210 sourced by a voltage (VDRV) provided by the first voltage source node 215, and the voltage (VDRV) is the maximum rated voltage of the transistor 210, such as six volts. Thus, the gate of the second transistor 210 is limited to VDRV while transitioning into an enabled state, and therefore the slew rate of the second transistor 210 is limited. Further, in the example of FIG. 2, the area of the transistor 240 may be larger, and therefore inefficient with respect to die area, than that of the topology of FIGS. 3, 4, and/or 8, as discussed below.

Figure 3:
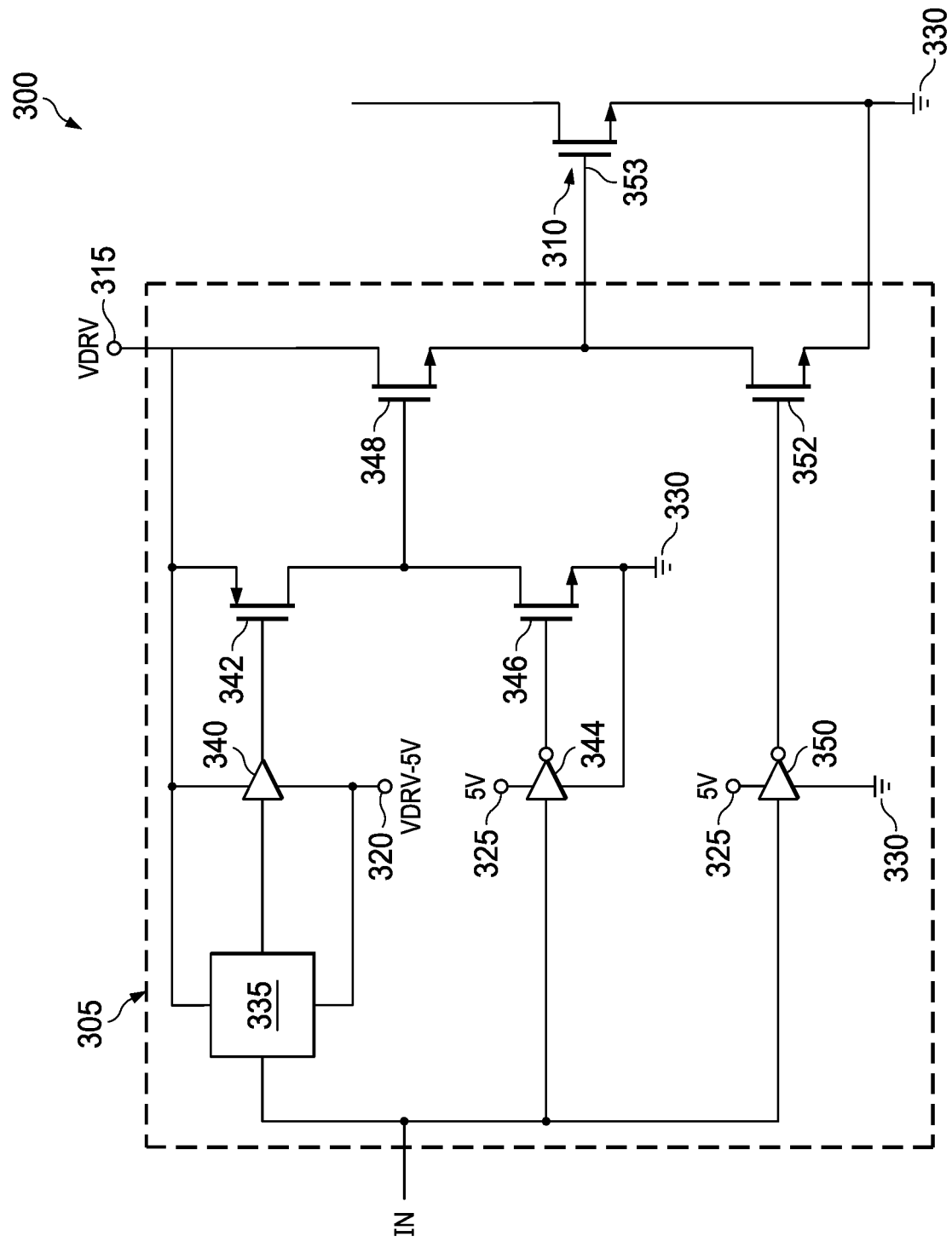
FIG. 3 is a second schematic illustration of a second driver of a power converter.

FIG. 3 is a second schematic illustration 300 of a driver 305 in a power converter. The second schematic illustration 300 includes the driver 305, a first transistor 310, a first voltage source node 315, a second voltage source node 320, a third voltage source node 325, and a ground node 330. The driver 305 includes an inverting level shifter 335, a buffer 340, a second transistor 342, a first inverter 344, a third transistor 346, a fourth transistor 348, a second inverter 350, and a fifth transistor 352. The first transistor 310 is an NMOS transistor, the second transistor 342 is a PMOS transistor, the third transistor 346 is an NMOS transistor, the fourth transistor 348 is an NMOS transistor, and the fifth transistor 352 is an NMOS transistor. The first transistor 310 includes a control terminal 353.

The inverting level shifter 335 amplifies the signal IN, inverts the shifted voltage signal, and provides the inverted voltage signal to the buffer 340. The buffer 340 removes glitches (e.g., unnecessary signal transitions) from the inverted voltage signal obtained from the inverting level shifter 335 and provides the voltage signal to coupled components (e.g., the second transistor 342) at a lower output impedance level than the output impedance level of the buffer 340. The inverting level shifter 335 and the buffer 340 enable and disable the second transistor 342 responsive to variations in the signal IN. The first inverter 344 inverts a voltage signal (e.g., the voltage signal IN) and provides the inverted voltage signal to the third transistor 346. The first inverter 344 enables and disables the third transistor 346 responsive to variations in the signal IN. The second transistor 342 and the third transistor 346 enable and disable the fourth transistor 348 responsive to variations in the signals provided by the buffer 340 and by the first inverter 344.

The second inverter 350 inverts a voltage signal (e.g., the signal IN) and provides the inverted voltage signal to the fifth transistor 352. The second inverter 350 enables and disables the fifth transistor 352 responsive to variations in the signal IN. During an on-state (e.g., the signal IN has a voltage of five volts), the second transistor 342 is conducting, and the third transistor 346 is not conducting. As a result, the fourth transistor 348 is conducting. Further, the fifth transistor 352 is not conducting. As a result of the fourth transistor 348 conducting and the fifth transistor 352 not conducting, the first transistor 310 is conducting.

During an off-state (e.g., the signal IN has a voltage of zero volts), the second transistor 342 is not conducting, and the third transistor 346 is conducting. As a result, the fourth transistor 348 is not conducting. Further, the fifth transistor 352 is conducting. As a result of the fourth transistor 348 not conducting and the fifth transistor 352 conducting, the first transistor 310 is not conducting.

The driver 305 illustrated in FIG. 3 enables the first transistor 310 through the first voltage source node 315 (e.g., sourced by VDRV). Therefore, the voltage at the gate of the first transistor 310 (e.g., a maximum voltage of the gate) is limited by the voltage signal VDRV, and the slew rate of the first transistor 310 is therefore limited.

In the example of FIG. 3, the driver 305 provides a control signal (such as a current signal) to the first transistor 310 sourced by a voltage (VDRV) provided by the first voltage source node 315, and the voltage (VDRV) is the maximum rated voltage of the first transistor 310, such as six volts. Thus, the gate of the first transistor 310 is limited to VDRV while transitioning into an enabled state, and therefore the slew rate of the transistor is limited. Further, in the example of FIG. 3, the control terminal of the transistors 310, 348 are limited to VDRV. Thus, the drive current provided to the first transistor 310 may decrease as the control terminal of the first transistor 310 increases. The slew rate of the first transistor 310 may be limited when the first transistor 310 provides a large current as the voltage ($V_{gs}$) at the first transistor 310 is higher due to the large current.

Figure 4:
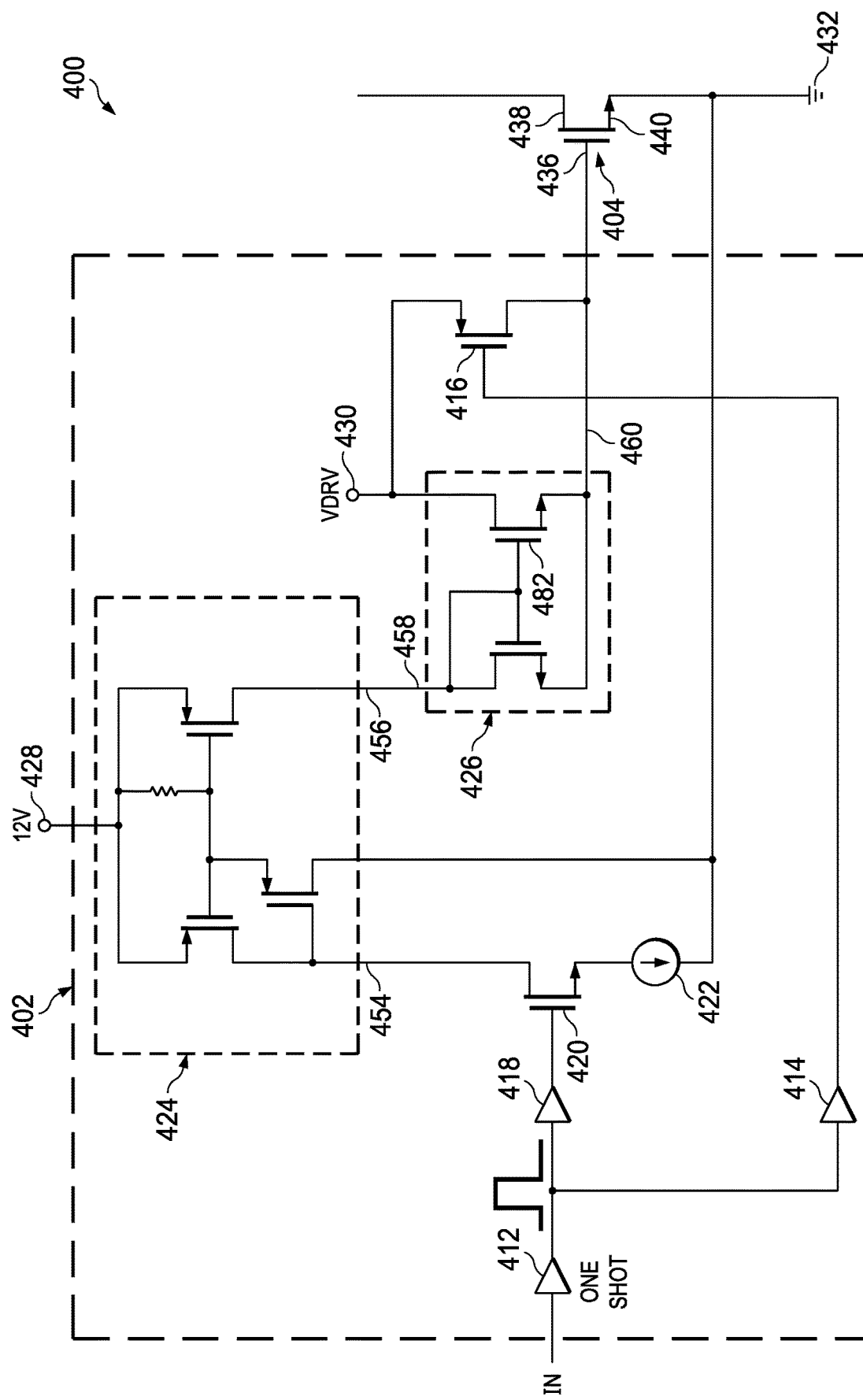
FIG. 4 is a third schematic illustration of a third driver of a power converter.

FIG. 4 is a third schematic illustration 400 of a driver 402 in a power converter. The driver 402 is adapted to receive an input signal (e.g., a voltage signal IN), and the driver 402 enables and disables the first transistor 404 responsive to variations in the signal IN. The driver 402 includes a one-shot pulse generator 412, a first buffer 414, a second transistor 416, a second buffer 418, a third transistor 420, a current source 422, a first current mirror circuit 424, and a second current mirror circuit 426. The third schematic illustration 400 includes a first voltage source node 428, a second voltage source node 430, and a ground node 432. The first transistor 404 and the third transistor 420 are NMOS transistors, and the second transistor 416 is a PMOS transistor. The first transistor 404 includes a control terminal 436, a drain terminal 438, and a source terminal 440 coupled to the ground node 432.

The one-shot pulse generator 412 and the first buffer 414 enable and disable the second transistor 416 responsive to variations in the signal IN. The second transistor 416 enables the first transistor 404. When the signal IN transitions into an on-state (e.g., transitions from a voltage of zero volts into a voltage of five volts), the one-shot pulse generator 412 generates a pulse signal. The first buffer 414 obtains the pulse signal, modifies the pulse signal (e.g., removes glitches from the pulse signal), and delivers the modified pulse signal to the second transistor 416. In response to the modified pulse signal, the second transistor 416 becomes disabled (e.g., does not begin conducting). When the second transistor 416 is not conducting, the first transistor 404 may be conducting (e.g., enabled by the second current mirror circuit 426, as discussed below) or not conducting (e.g., not enabled by the second current mirror circuit 426).

The first current mirror circuit 424 includes a first terminal 454, which is coupled to the third transistor 420 and a second terminal 456. The second current mirror circuit 426 includes a first terminal 458 coupled to the second terminal 456 of the first current mirror circuit 424. The second current mirror circuit 426 includes a second terminal 460 coupled to the first transistor 404. In operation, when the signal IN transitions into an on-state (e.g., transitions from a voltage of zero volts into a voltage of five volts), the one-shot pulse generator 412 generates a pulse signal. The second buffer 418 obtains the pulse signal, modifies the pulse signal (e.g., removes glitches from the pulse signal), and provides the modified pulse signal to the third transistor 420. As a result, the third transistor 420 is enabled (e.g., begins conducting) in response to obtaining the modified pulse signal.

The current source 422 provides a current to the first current mirror circuit 424 when the third transistor 420 is enabled. The first current mirror circuit 424 mirrors the current from the first terminal 454 at the second terminal 456. The second current mirror circuit 426 obtains the current at the first terminal 458 and mirrors the current at the second terminal 460 (and control terminal 436). As a result, the first transistor 404 is enabled and begins to conduct.

During operation, the one-shot pulse generator 412 generates a pulse responsive to a voltage of the signal IN exceeding a threshold. The first buffer 414 provides an output signal to the second transistor 416, and thus the second transistor 416 is not conducting. The second buffer 418 obtains the output signal of the one-shot pulse generator 412 and generates an output signal to enable the third transistor 420 (e.g., the third transistor 420 is conducting). Responsive to the third transistor 420 conducting, a current signal is generated at the first terminal 454 of the first current mirror circuit 424 by the current source node 422. Thus, the first current mirror circuit 424 generates a current signal at the second terminal 456. The second current mirror circuit 426 obtains the current signal at the first terminal 458 and generates an output signal at the second terminal 460 (e.g., the control terminal 436 of the first transistor 404). Responsive to the output signal of the second current mirror circuit 426, the first transistor 404 is enabled by the first voltage source node 428 (e.g., the node coupled to the first current mirror circuit 424) and by the second voltage source node 430 (e.g., the node coupled to the second current mirror circuit 426).

After the one shot pulse generator 412 has generated an output signal pulse (e.g., the voltage generated by the one-shot pulse generator 412 is zero volts), the third transistor 420 is disabled (e.g., not conducting). As a result, the first current mirror circuit 424 does not generate an output signal at the second terminal 456, and the second current mirror circuit 426 does not generate an output signal at the second terminal 460. Since the output of the first buffer 414 is a low voltage (preferably around zero volts), the second transistor 416 begins to conduct. As a result, the first transistor 404 is enabled by the second voltage source node 430 (e.g., the node coupled to the second transistor 416).

Under certain operating conditions, the second current mirror circuit 426 generates a current signal based on a current signal obtained from the first current mirror circuit 424 (e.g., obtained from a circuit operating with a potential of twelve volts). As a result, the control terminal 436 of the first transistor 404 is limited to VDRV (e.g., six volts) during a transition into an on-phase. However, the maximum voltage of the gate of the first transistor 404 is limited because the second current mirror circuit 426 (e.g., a transistor 482 included in the second current mirror circuit 426) is coupled to the second voltage source node 430 (e.g., six volts). Therefore, the gate terminal (e.g., the control terminal 436) of the first transistor 404 is limited and cannot provide a large slew rate.

In the example of FIG. 4, the second terminal 460 of the second current mirror circuit 426 is limited to VDRV. Thus, the maximum voltage of the control terminal 436 is limited when transitioning into an enabled state. Because the first transistor 404 may necessitate a voltage greater than VDRV during the transition state (e.g., the maximum rated voltage of the first transistor 404) in order to maintain a high slew rate, the second current mirror circuit 426 (e.g., the transistor coupled between the second voltage source node 430 and the second terminal 460) and/or the first transistor 404 may run out of headroom provided by VDRV and, thus, be unable to maintain a high slew rate (e.g., due to a weak and/or a hot corner).

Figure 5:
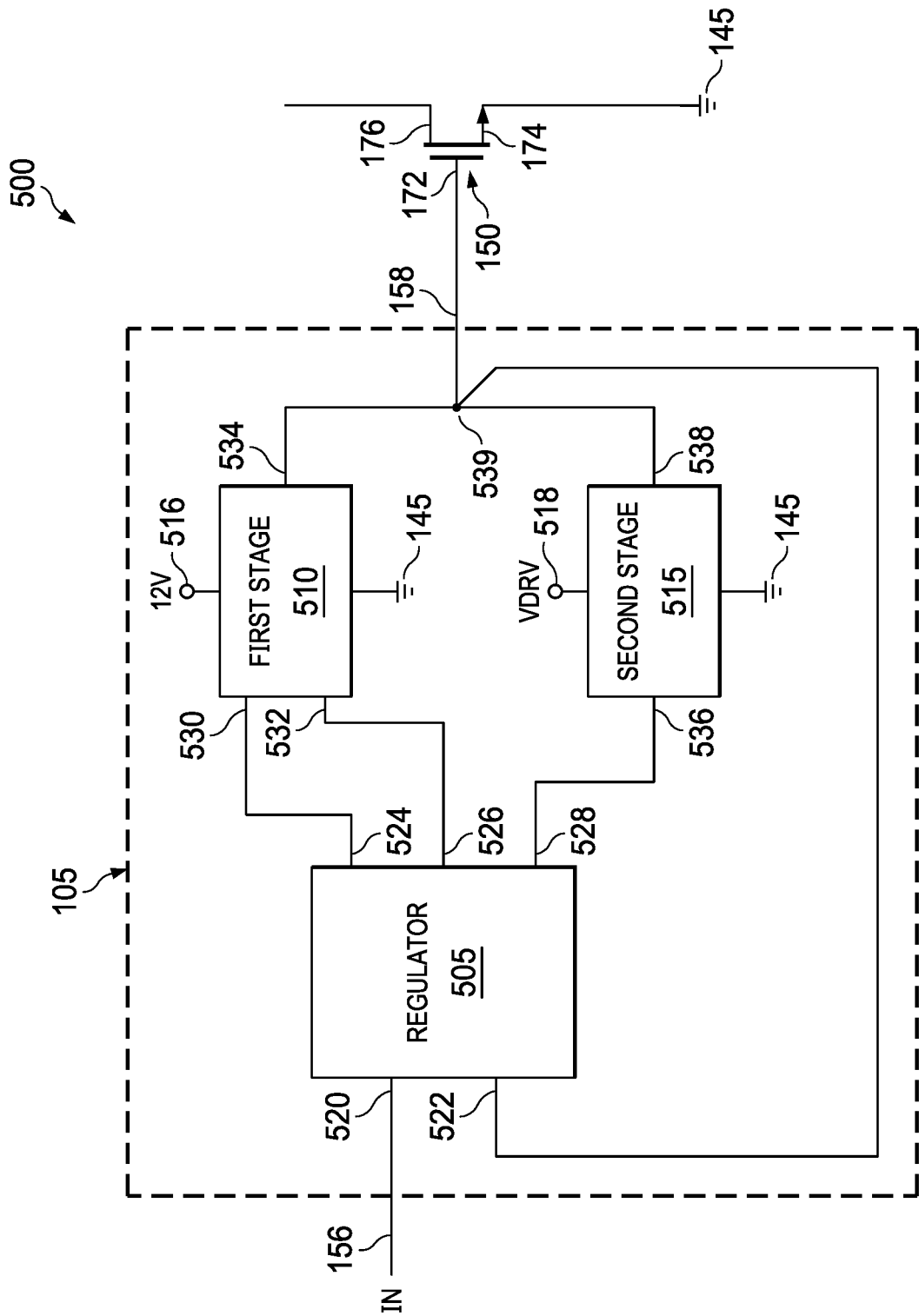
FIG. 5 is a block diagram of an example implementation of the first driver of FIG. 1 that is adapted to enable a transistor responsive to an input signal at an input terminal.

FIG. 5 is a block diagram of an example implementation 500 of the first driver 105 of FIG. 1 that is adapted to enable a transistor (e.g., the transistor 150 of FIG. 1) responsive to an input signal (e.g., the signal IN) at an input terminal (e.g., the input terminal 156 of FIG. 1). The implementation 500 includes the driver 105, the ground node 145, the input terminal 156, the output terminal 158, and the transistor 150 of FIG. 1. The transistor 150 includes the control terminal 172, the source terminal 174, and the drain terminal 176 of FIG. 1. In the illustrated example of FIG. 5, the first driver 105 includes an example regulator 505, a first example stage 510, and a second example stage 515. In the topology of FIG. 5, the first driver 105 is adapted to be coupled to a first example voltage source node 516 and a second example voltage source node 518. In some examples discussed herein, the first voltage source node 516 is coupled to a first voltage source, and the second voltage source node 518 is coupled to a second voltage source. The first voltage source may have a first electric potential that is higher than a second electric potential of the second voltage source. For example, the first voltage source node 516 can be coupled to a first voltage source having an electric potential of twelve volts, and the second voltage source node 518 can be coupled to a second voltage source having an electric potential of VDRV, such as six volts. The voltage source nodes 516, 518 can include a voltage source. For example, the first voltage source node 516 can include a voltage source configured to deliver an electric potential of ten volts.

The first driver 105 of FIG. 5 can respond to variations in the activation signal (e.g., the signal IN exceeding a voltage threshold) by providing a first control signal to the output terminal 158 and the control terminal 172 to enable the transistor 150 (e.g., the transistor 150 begins conducting). The first control signal can be provided by the first stage 510 as a voltage and/or a current from the first voltage source node 516. Responsive to a voltage at the output terminal 158, the first driver 105 can provide a second control signal alternative to the first control signal to enable the transistor 150. The second control signal may be provided by the second stage 515 as a voltage and/or a current from the second voltage source node 518, and the first voltage source node 516 (e.g., a first voltage source) may include a higher potential (e.g., an electric potential) than the second voltage source node 518 (e.g., a second voltage source). For example, the first voltage source node 516 can provide a voltage of twelve volts, and the second voltage source node 518 can provide a voltage of six volts. In some examples, the first driver 105 may include additional and/or alternative circuitry to disable the transistor 150 based on a variation (such as a lowering) of the activation signal provided by the controller 120 of FIG. 1.

In operation, the regulator 505 can be adapted to enable the first stage 510 by providing a first trigger signal to the first stage 510. The first stage 510 can be adapted to enable the transistor 150 by a current (e.g., a first control signal, a gate drive current, a current signal) from a first voltage source (e.g., by a current from the first voltage source node 516). The first stage 510 can be adapted to enable the transistor 150 by providing a first control signal to the control terminal 172 of the transistor 150 responsive to the first trigger signal provided by the regulator 505 exceeding a threshold voltage level (e.g., a logic high value, three volts, etc.). The regulator 505 can be adapted to regulate the output (e.g., the first control signal, the gate drive current, etc.) of the first stage 510 by providing a regulation signal to the first stage 510 responsive to a voltage at the control terminal 172 exceeding a voltage threshold. For example, if the voltage at the control terminal 172 exceeds a clamp voltage (e.g., eight volts) provided by a clamp voltage source, the regulator 505 can provide a regulation signal at the second output terminal 526 to regulate the voltage at the control terminal 172 to the clamp voltage. The regulator 505 can be adapted to disable the first stage 510 by providing a logic output signal at the first input terminal 530 responsive to a signal (e.g., a current and/or voltage) at the second input terminal 522 exceeding a clamp voltage for a certain amount of time (e.g., a period of time after the voltage exceeds the clamp voltage for fifty nanoseconds, etc.).

In operation, the regulator 505 can be configured to enable the second stage 515 by transmitting and/or otherwise delivering a second trigger signal to the second stage 515. The second stage 515 can be adapted to enable the transistor 150 by providing a current from a second source (e.g., the second voltage source node 518). The second stage 515 can be adapted to enable the transistor 150 by providing a second control signal to the control terminal 172 of the transistor 150 responsive to the second trigger signal provided by the regulator 505 exceeding a threshold voltage level (e.g., a logic high value, two volts).

In some examples discussed herein, the first voltage source node 516 can provide a voltage (such as twelve volts) higher than that of the second voltage source node 518 to improve headroom of the transistor 150 during switching, such as during a transition into an enabled state. In some examples discussed herein, the first driver 105 can include a fast current source pull-up (such as a transistor and/or a first stage) to set, determine, and/or otherwise regulate the slew rate of the transistor 150 while limiting a voltage at the control terminal 172. Advantageously, the first driver 105 can limit the voltage at the control terminal 172 to prevent damage to the transistor 150 during a transition into an enabled state. In some examples discussed herein, the first driver 105 can disable the fast pull-up (such as a transistor and/or a first stage) after the voltage of the control terminal 172 reaches a plateau voltage (such as a clamp voltage). In some examples discussed herein, the first driver 105 can include a weak pull-up (such as a transistor and/or a second stage) to hold the control terminal 172 at a direct current (DC) operating voltage, such as the maximum rated voltage of the transistor, VDRV, six volts, etc.

In operation, the output stage headroom (e.g., the headroom of the transistor 150 provided by the first driver 105) is not limited to VDRV during a transition into an enabled state because the first driver 105 provides a control signal to the transistor 150 sourced by the first voltage source node 516, which includes an electric potential greater than that of the second voltage source node 518. Further, in operation, the first driver 105 can limit the control terminal 172 to an operating voltage (e.g., six volts, VDRV, etc.) to enable the transistor 150 in steady state without damaging the transistor 150. In some examples discussed herein, most of the charge (e.g., voltage) of the control terminal 172 can be provided by the first voltage source node 516 instead of the second voltage source node 518. Thus, the second voltage source node 518 may not be required to supply a large current during operation.

Advantageously, by driving (e.g., enabling) the control terminal 172 sourced by a current source (e.g., IDRV) from a high voltage rail (e.g., the first voltage source node 516), more headroom can be provided to the transistor 150 to effectuate a high slew rate. Further, a fast voltage regulation loop (e.g., the regulator 505) can be included in the first driver 105 to limit the gate voltage (e.g., the voltage at the control terminal 172) in transient (e.g., during a transition into an enabled state). A gate voltage detector (e.g., the regulator 505, a linear regulator, and/or a comparator circuit) can be included in the first driver 105 to turn off (e.g., disable) the fast pull-up drive (e.g., the first stage 510) and enable a weak pull-up (e.g., the second stage 515) for long term reliability and low power consumption. Advantageously, in some examples disclosed herein, the first driver 105 can provide a constant and/or consistent slew rate over process corners and/or temperatures.

In some examples, the transistor 150 can transition into an enabled state in response to the first control signal in a shorter period of time than in response to the second control signal. For example, the transistor 150 can transition at a first slew rate responsive to the first control signal, the transistor 150 can then transition at a second slew rate responsive to the second control signal, and the first slew rate can be greater than the second slew rate. In some examples, the transistor 150 can be damaged and/or destroyed when driven (such as enabled) by the first control signal for an extended period of time. Because the first driver 105 regulates the first control signal (e.g., disables the first control signal) and enables the second control signal such that the transistor 150 remains in an enabled state, the first driver 105 enables the transistor 150 to begin conducting at a slew rate provided by the first voltage source node 516 greater than that of a slew rate provided by the second voltage source node 518 and/or to enable the transistor 150 for a period of time without reducing the operability of the transistor 150 (e.g., without the transistor 150 being destroyed in operation).

In the illustrated example of FIG. 5, the regulator 505 has and/or otherwise includes a first input terminal 520, a second input terminal 522, a first output terminal 524, a second output terminal 526, and a third output terminal 528. The first input terminal 520 is coupled to the input terminal 156 of the driver 105 in a configuration to obtain an activation signal (IN). The regulator 505 is adapted to obtain the activation signal (e.g., the signal IN provided by the controller 120). In some examples, the regulator 505 enables the first stage 510 by delivering a first trigger signal at the first output terminal 524 and enables the second stage 515 by delivering a second trigger signal at the third output terminal 528. The regulator 505 enables the first stage 510 to enable the transistor 150 responsive to the activation signal exceeding a threshold voltage level, such as a logic high threshold. In some examples, the regulator 505 provides a regulation signal to the first stage 510 at the second output terminal 526, and the first stage 510 may vary a first control signal provided to the output terminal 158 responsive to the regulation signal.

The regulator 505 enables the second stage 515 responsive to a signal (e.g., a voltage signal) obtained at the second input terminal 522. For example, if a voltage obtained at the second input terminal 522 (such as at the output terminal 158 and/or at the control terminal 172) exceeds a voltage threshold provided by a clamp voltage source node, the regulator 505 may clamp the voltage at the control terminal 172 and provide a second trigger signal to the second stage 515. In some examples, the regulator 505 provides the second trigger signal responsive to the voltage obtained at the second input terminal 522 exceeding a voltage threshold (such as VCLAMP) for a period of time. In some examples, the regulator 505 may vary (such as cease) providing the first trigger signal additionally to and/or alternative to providing the second trigger signal.

The first stage 510 has and/or otherwise includes a first input terminal 530 coupled to the first output terminal 524 of the regulator 505 to obtain the first trigger signal, a second input terminal 532 coupled to the second output terminal 526 of the regulator 505 to obtain the regulation signal, and an output terminal 534 coupled to the output terminal 158 of the first driver 105 (e.g., to the control terminal 172 of the transistor 150) to provide the first control signal. In FIG. 5, the first stage 510 is adapted to be coupled to the first voltage source node 516 and to the ground node 145. The first stage 510 provides (e.g., outputs) a first control signal at the output terminal 534 (e.g., to the output terminal 158 of the first driver 105 and/or to the control terminal 172 of the transistor 150) responsive to the first trigger signal obtained at the first input terminal 530 exceeding a threshold voltage level. Thus, the first stage 510 enables the transistor 150. In some examples, the first stage 510 varies and/or otherwise modifies the first control signal (such as disabling the first control signal) responsive to the first trigger signal not exceeding a voltage threshold value, such as a logic high voltage threshold. In some examples, the first stage 510 varies the first control signal responsive to the regulation signal obtained at the second input terminal 532.

The second stage 515 has and/or otherwise includes an input terminal 536 coupled to the third output terminal 528 of the regulator 505 to obtain the second trigger signal and an output terminal 538 coupled to the output terminal 534 of the first stage 510 at an example node 539 to provide the second control signal. In FIG. 5, the node 539 is coupled to the second input terminal 522 of the regulator 505, to the output terminal 158 of the first driver 105, and to the control terminal 172 of the transistor 150. The second stage 515 is adapted to be coupled to the second voltage source node 518 and to the ground node 145. The second stage 515 provides a second control signal at the output terminal 538 (e.g., to the output terminal 158 of the driver 105 and/or to the control terminal 172 of the transistor 150) responsive to the second trigger signal obtained at the input terminal 536 exceeding a threshold voltage level, such as a logic high value. Thus, the second stage 515 can enable the transistor 150 responsive to the second trigger signal provided by the regulator 505 at the third output terminal 528 and obtained at the input terminal 536. In some examples, the second stage 515 provides the second control signal responsive to the second trigger signal not exceeding a threshold voltage level, such as a logic low value.

In operation, the regulator 505 obtains an activation signal at the first input terminal 520. Responsive to the activation signal exceeding a threshold voltage level (such as a logic high level, five volts, etc.), the regulator 505 delivers and/or is otherwise adapted to transmit a first trigger signal to the first stage 510 at the first output terminal 524. Responsive to the first trigger signal exceeding a threshold voltage level, the first stage 510 provides and/or is otherwise adapted to generate a first control signal at the output terminal 534 (e.g., to the node 539, to the output terminal 158 of the driver 105, to the control terminal 172, etc.) to enable the transistor 150 with a current provided by the first voltage source node 516. In some examples, the regulator 505 provides a regulation signal to the first stage 510 at the first output terminal 524 responsive to a variation in a signal obtained at the second input terminal 522. For example, if a voltage at the node 539 exceeds a threshold (such as a clamp voltage threshold), the regulator 505 can vary (such as decrease and/or disable) the regulation signal. The first stage 510 can then vary (such as decrease and/or disable) the first control signal enabling the transistor 150 responsive to the variation in the regulation signal obtained at the second input terminal 532.

In response to a signal (e.g., voltage value) at the node 539 (e.g., a voltage exceeding a voltage threshold (e.g., a clamp voltage) for a period of time, the regulator 505 can provide a second trigger signal at the third output terminal 528 to the second stage 515. Responsive to the second trigger signal, the second stage 515 can provide and/or otherwise is adapted to output a second control signal at the output terminal 538 to the output terminal 158 of the driver (e.g., to the control terminal 172) with a current provided by the second voltage source node 518. Thus, the transistor 150 is first enabled by a current provided by the first voltage source node 516 and then enabled (e.g., kept on, held in the enabled mode) by a current provided by the second voltage source node 518.

Figure 6:
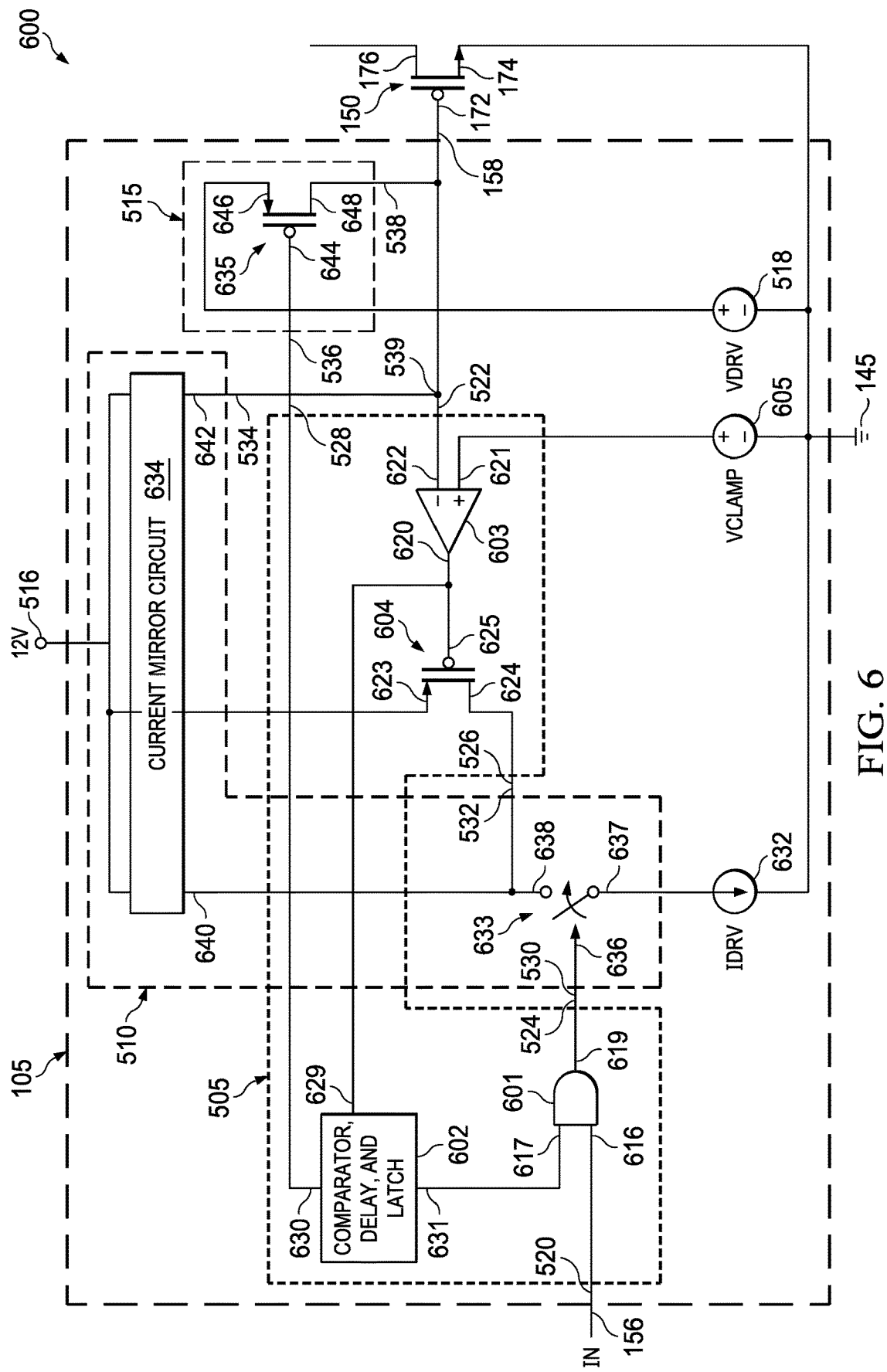
FIG. 6 is a diagram of an example implementation of the first driver of FIGS. 1 and/or 5.

FIG. 6 is a diagram of an example implementation 600 of the first driver 105 of FIGS. 1 and/or 5 adapted to enable a transistor (e.g., the transistor 150 of FIG. 1) responsive to an example input signal (e.g., an activation signal, the signal IN, etc.) at an example input terminal (e.g., the example input terminal 156 of FIG. 1). The implementation 600 of FIG. 6 includes the first driver 105, the ground node 145, the input terminal 156, the output terminal 158, and the transistor 150 of FIGS. 1 and/or 5. The transistor 150 includes the control terminal 172, the source terminal 174, and the drain terminal 176 of FIGS. 1 and/or 5. In the example of FIG. 6, the first driver 105 includes the regulator 505, the first stage 510, the second stage 515, the first voltage source node 516, and the second voltage source node 518 of FIG. 5.

In the illustrated example of FIG. 6, the regulator 505 includes a logic gate 601, a comparator, delay and latch circuit 602 (hereinafter referred to as "comparator 602"), a linear regulator circuit 603, and a transistor 604. The regulator 505 is adapted to be coupled to an example clamp voltage source node 605. In examples discussed herein, the clamp voltage source node 605 is coupled to a voltage source in a configuration to (1) drive the transistor 150 at a higher slew rate and (2) provide an electric potential (such as VCLAMP) greater than that of a voltage source (such as VDRV) coupled to the second voltage source node 518 and less than that of the first voltage source node 516 (such as twelve volts). For example, a first voltage source coupled to the first voltage source node 516 can provide twelve volts, a second voltage source coupled to the second voltage source node 518 can provide six volts, and a third voltage source coupled to the clamp voltage source node 605 can provide eight volts. However, any of the clamp voltage source node 605, the first voltage source node 516, and/or the second voltage source node 518 may be coupled to a voltage source that provides any suitable voltage, such as zero volts, ten volts, one hundred volts, etc.

In the illustrated example of FIG. 6, the logic gate 601 includes a first input terminal 616 coupled to the first input terminal 520 of the regulator 505 to obtain the activation signal (IN), a second input terminal 617 to obtain a signal (e.g., a logic low value) from the comparator circuit 602, and an output terminal 619 coupled to the first output terminal 524 of the regulator 505 to provide the first trigger signal. In the topology illustrated in FIG. 6, the logic gate 601 is an example complimentary AND gate. In some examples, any suitable combination of logic gates and/or circuits may be used to implement the logic gate 601. The logic gate 601 provides and/or is otherwise adapted to output the first trigger signal at the output terminal 619 (e.g., at the first output terminal 524 of the regulator and/or to the first input terminal 530 of the first stage 510). For example, the logic gate 601 can provide the first trigger signal responsive to (1) a voltage of the signal obtained at the first input terminal 616 (such as the activation signal, the signal IN, etc.) and (2) the voltage at the second input terminal 617 exceeding a threshold voltage level, such as a logic high threshold of five volts. In other examples, the logic gate 601 can vary (such as lower) the first trigger signal responsive to the activation signal and/or the third trigger signal not exceeding a threshold voltage level. The logic gate 601 is configured to enable the first stage 510 by delivering the first trigger signal to the first input terminal 530 of the first stage 510.

The linear regulator circuit 603 includes an output terminal 620 to regulate the transistor 604, a first input terminal 621 (such as a non-inverting input) adapted to be coupled to the clamp voltage source 605, and a second input terminal 622 (such as an inverting input) coupled to the second input terminal 522 of the regulator 505 to obtain a signal (e.g., a voltage) at the control terminal 172. In the topology illustrated in FIG. 6, the linear regulator circuit 603 is an example linear amplifier, such as a comparator. However, any suitable combination of circuits and/or logic gates may be used to implement the linear regulator circuit 603. In operation, the linear regulator circuit 603 is adapted to regulate the voltage at the second input terminal 622 (e.g., at the node 539, at the control terminal 172 of the transistor 150, etc.) through the transistor 604 responsive to a comparison of the signal obtained at the first input terminal 621 (e.g., a voltage threshold level VCLAMP provided by the clamp voltage source 605) to the signal obtained at the second input terminal 622 (e.g., a voltage at the control terminal 172 of the transistor 150). In some examples, the linear regulator circuit 603 regulates (such as adjusts) a current through the transistor 604. Thus, because the transistor 604 is coupled to the first stage 510 (e.g., to the switching circuit 633 coupled to the current source 632), the linear regulator circuit 603 regulates the current provided to the current mirror circuit 634 at the first terminal 640, and therefore regulates the current provided to the control terminal 172 by the current mirror circuit 634 at the second terminal 642. In some examples, the linear regulator circuit 603 regulates the voltage at the second input terminal 622 such that the voltage substantially tracks (such as being equal to) the voltage at the first input terminal 621, such as the voltage VCLAMP provided by the clamp voltage source node 605. For example, if the voltage at the second input terminal 622 is greater than the voltage at the first input terminal 621, the linear regulator circuit 603 may decrease the output at the output terminal 620, thereby increasing the current flow from the source terminal 623 to the drain terminal 624 of the transistor 604. Because the transistor 604 and the current mirror circuit 634 are adapted to be coupled to the current source node 632 through the switching circuit 633, the linear regulator circuit 603 and/or the transistor 604 therefore decrease the current provided to the first terminal 640 of the current mirror circuit 634.

The transistor 604 includes a source terminal 623 (e.g., a first current terminal) adapted to be coupled to the first voltage source node 516, a drain terminal 624 (e.g., a second current terminal) coupled to the second output terminal 526 of the regulator 505 to provide the regulation signal, and a control terminal 625 (e.g., a gate terminal) coupled to the output terminal 620 to obtain an output from the linear regulator circuit 603. In operation, the transistor 604 provides a regulation signal (e.g., a current) to the first stage 510 at the second output terminal 526 responsive to a signal provided by the linear regulator circuit 603 at the control terminal 625. For example, if the voltage at the second input terminal 522 is higher than the voltage at the first input terminal 621 (VCLAMP), the linear regulator circuit 603 can increase the current provided to the control terminal 625 of the transistor 604. Thus, the first stage 510 can drive the transistor 150 with a lower control signal (e.g., with less current), and the voltage at the node 539 (e.g., the control terminal 172, the second input terminal 522) decreases to the voltage VCLAMP provided by the clamp voltage source node 605. Responsive to the regulation signal, the first stage 510 can increase or decrease the first control signal (e.g., a current signal, a control current) at the output terminal 534, thereby regulating the control terminal 172 of the transistor 150, such as the voltage at the control terminal 172.

The comparator circuit 602 (e.g., a comparator, delay, and/or latching circuit) includes an input terminal 629 coupled to the output terminal 620 to obtain an output from the linear regulator circuit 603, a first output terminal 630 coupled to the third output terminal 528 of the regulator 505 (e.g., to the input terminal 536 of the second stage 515) to enable the second stage 515, and a second output terminal 631 coupled to the second input terminal 617 to provide a signal (e.g., a logic low value) to the logic gate 601. The comparator circuit 602 enables the second stage 515 (e.g., a transistor included in the second stage 515 and coupled to the input terminal 536) by providing the second trigger signal at the first output terminal 630 responsive to variations in the output of the linear regulator circuit 603. In some examples, the comparator circuit 602 obtains a signal (e.g., an analog voltage value) provided by the linear regulator circuit 603 at the input terminal 629. The comparator circuit 602 can convert the analog signal into a digital signal (e.g., logic high values, logic low values, etc.), and output a logic low value at the output terminals 630, 631 responsive to the signal at the input terminal 629 not exceeding a voltage threshold for a period of time (e.g., a delay). The comparator circuit 602 can include a filter circuit (e.g., a resistor and a capacitor) to respond to the signal obtained at the input terminal 629 after a period of time (e.g., twenty nanoseconds). The comparator circuit 602 can include and/or be adapted to be coupled to a reference voltage node.

In operation, the comparator circuit 602 can provide a first voltage signal (e.g., a logic high value) at the output terminals 630, 631 if a signal at the input terminal 629 exceeds a threshold (e.g., a logic high voltage threshold, two volts, three volts, etc.) for a period of time. In operation, the comparator circuit 602 can provide a second voltage signal (e.g., a logic low value) at the output terminals 630, 631 if a signal at the input terminal 629 does not exceed a threshold (e.g., a logic high voltage threshold, two volts, three volts, etc.) for a period of time. Thus, by providing the second voltage signal, the comparator circuit 602 can disable the logic gate 601, therefore disabling the first stage 510. Further, by providing the second voltage signal (e.g., the second control signal) to the second stage 515, the comparator circuit 602 can enable the second stage 515, therefore enabling the transistor 150.

In the example illustrated in FIG. 6, the first stage 510 is adapted to be coupled to a current source 632 and to the first voltage source node 516. The first stage 510 includes an example switching circuit 633 and an example current mirror circuit 634. The second stage 515 includes a transistor 635. In the topology depicted in FIG. 6, the second stage 515 is adapted to be coupled to the second voltage source node 518. In the topology depicted in FIG. 6, the first voltage source node 516 has an electric potential higher than that of the second voltage source node 518. For example, the first voltage source node 516 can have an electric potential of twelve volts, and the second voltage source node 518 can have an electric potential of six volts. The current source 632 can provide a current (e.g., a mirror signal, a current mirror signal, a signal IDRV, a signal Iref, etc.) to the current mirror circuit 634 and/or the first stage 510.

The switching circuit 633 includes a first terminal 636 coupled to the first input terminal 530 of the first stage 510 to obtain the first trigger signal, a second terminal 637 adapted to be coupled to the current source node 632, and a third terminal 638 to provide a current signal to the current mirror circuit 634. The switching circuit 633 electrically connects the second terminal 637 to the third terminal 638 responsive to obtaining a logic high value at the first terminal 636. The switching circuit 633 may be implemented by any suitable switching device (e.g., a MOSFET, a BJT, a double pole single throw (DPST) switch, etc.). In some examples, the switching circuit 633 can be implemented with one or more NMOS transistors. The switching circuit 633 electrically connects the second terminal 637 to the third terminal 638 responsive to a signal obtained at the first terminal 636 (e.g., the first control signal provided by the logic gate 601) exceeding a voltage threshold.

The current mirror circuit 634 includes a first terminal 640 coupled to the third terminal 638 of the switching circuit 633 and to the second input terminal 532 of the first stage 510 to obtain a current signal. The current mirror circuit 634 includes a second terminal 642 coupled to the output terminal 534 of the first stage 510 to provide the control signal to the control terminal 172. In the example of FIG. 6, the current mirror circuit 634 provides the first control signal at the second terminal 642 to the control terminal 172 of the transistor 150 responsive to obtaining a signal (such as a mirror signal, a current mirror signal, etc.) at the first terminal 640. For example, the switching circuit 633 and the transistor 604 can be enabled, therefore providing a mirror current (such as the signal IDRV) to the first terminal 640 sourced by the current source node 632, and the current mirror circuit 634 may then provide the first control signal to the control terminal. For example, the current mirror circuit 634 can obtain the signal IDRV at the first terminal 640 responsive to the switching circuit 633 being enabled and provide a signal at the second terminal 642 to the control terminal 172. In some examples, a second current mirror circuit, or any number of current mirror circuits, may be coupled between the second terminal 642 and the node 539 to provide additional current to enable the transistor 150. In some examples, the regulator 505, such as the linear regulator circuit 603 and/or the transistor 604, may enable and/or disable the current mirror circuit 634 to provide the first control signal responsive to a voltage at the second input terminal 522 of the regulator 505.

The second stage 515 includes the transistor 635. The transistor 635 includes a control terminal 644 coupled to the input terminal 536 of the second stage 515 to obtain the second trigger signal, a source terminal 646 adapted to be coupled to the second voltage source node 518, and a drain terminal 648 coupled to the output terminal 538 of the second stage 515 to provide the second control signal. The transistor 635 provides the second control signal at the output terminal 538 of the second stage 515 to enable the transistor 150 responsive to the second trigger signal obtained at the control terminal 644 (e.g., provided by the comparator circuit 602 at the input terminal 536).

In operation, responsive to the voltage at the control terminal 172 exceeding the clamp voltage source node 605, the linear regulator circuit 603 regulates and/or clamps the voltage through the transistor 604 by providing a regulation signal to the first stage 510. Thus, the voltage at the control terminal 172 is regulated to not exceed a maximum voltage (e.g., VCLAMP). Responsive to the voltage at the control terminal 172 (e.g., at the second input terminal 522, at the node 539, at the second input terminal 622) reaching the voltage VCLAMP for a period of time (e.g., after a delay), the comparator circuit 602 provides the second trigger signal (e.g., a logic low value) at the output terminal 620 to the second stage 515. In some examples, the comparator circuit 602 delays and/or otherwise waits to provide the second trigger signal until a voltage at the input terminal 629 does not exceed a threshold (such as a logic low value) for a period of time. As a result, the transistor 635 is enabled and therefore enables the transistor 150 with a current provided by the second voltage source node 518. In some examples, the logic gate 601 may vary the first control signal (e.g., lowering the signal to zero volts) responsive to the variation of the second trigger signal, and the switching circuit 633 therefore is disabled.

Figure 7A:
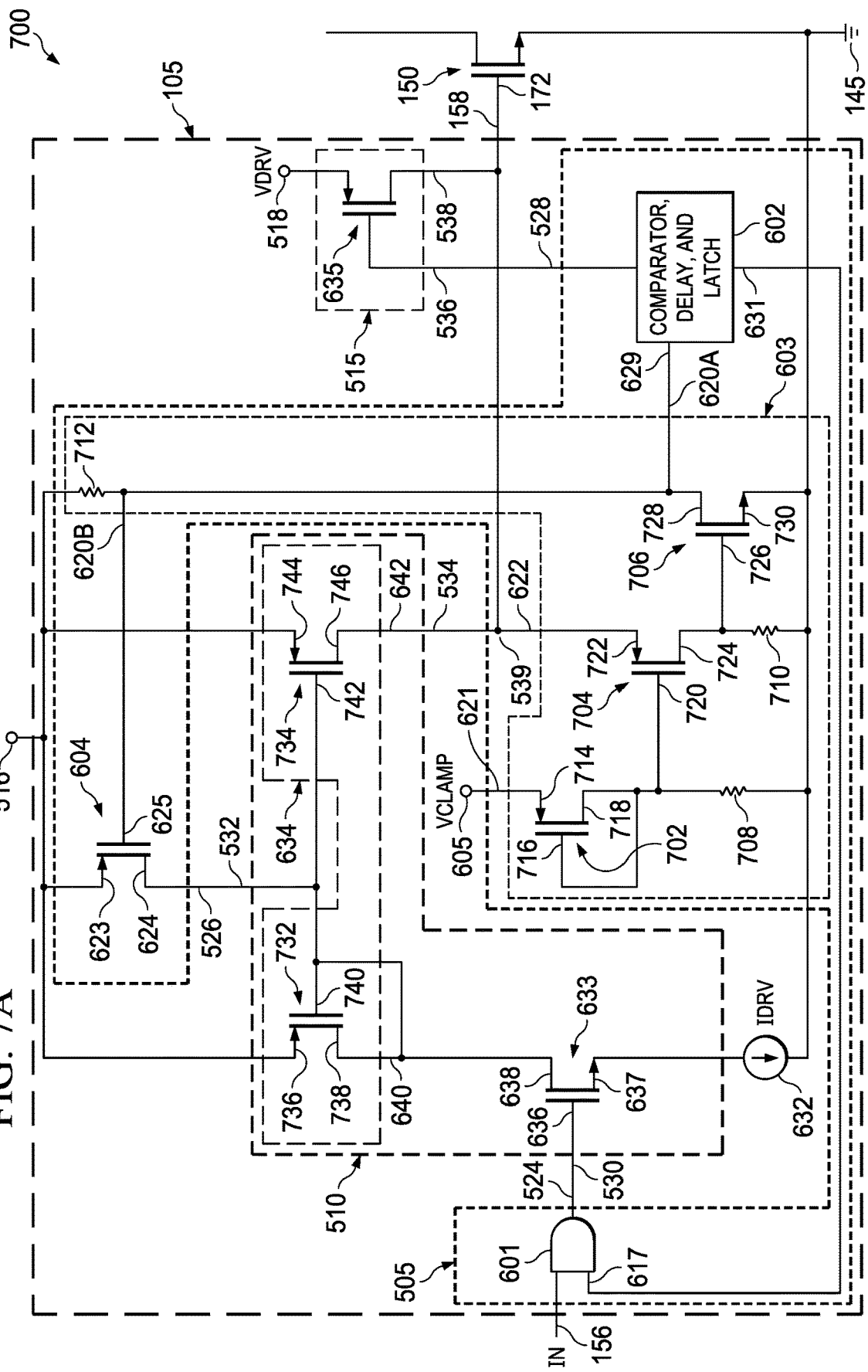
FIGS. 7A and 7B are diagrams of an example implementation of the first driver of FIGS. 1, 5, and/or 6, including additional logic circuitry to the implementation depicted in FIG. 6.

FIG. 7A is a diagram of an example implementation 700 of the first driver 105 of FIGS. 1, 5, and/or 6 including additional logic circuitry to the implementation 600 of FIG. 6. The implementation 700 includes the driver 105, the ground node 145, the transistor 150, the input terminal 156, and the output terminal 158 of FIG. 1. In the example of FIG. 7A, the first driver 105 includes the regulator 505, the first stage 510, the second stage 515, the first voltage source node 516, and the second voltage source node 518 of FIG. 5. In the topology of FIG. 7A, the first driver 105 includes the clamp voltage source node 605 and the current source node 632 of FIG. 6.

The regulator 505 includes the logic gate 601, the comparator circuit 602, and the linear regulator circuit 603. In operation, the logic gate 601 provides the first trigger signal at the first output terminal 524 of the regulator and/or to the first input terminal 530 of the first stage 510. In some examples, the logic gate 601 can provide the first trigger signal responsive to the activation signal (IN) and a signal obtained at the second input terminal 617 exceeding a voltage threshold, such as a logic high value. The logic gate 601 enables the switching circuit 633 of the first stage 510 by providing the first trigger signal to the first input terminal 530 of the first stage 510.

The linear regulator circuit 603 includes a first transistor 702, a second transistor 704, a third transistor 706, a first resistor 708, a second resistor 710, and a third resistor 712. In the topology of FIG. 7A, the first transistor 702 and the second transistor 704 each are PMOS transistors, and the third transistor 706 is an NMOS transistor. The first transistor 702 includes a source terminal 714 coupled to the first input terminal 621 of the linear regulator circuit 603 (e.g., is adapted to be coupled to the clamp voltage source node 605), a control terminal 716, and a drain terminal 718 coupled to the control terminal 716. The first resistor 708 is coupled between the drain terminal 718 of the first transistor 702 and the ground node 145. The second transistor 704 includes a control terminal 720 coupled to the drain terminal 718 of the first transistor 702, a source terminal 722 coupled to the second input terminal 622 of the linear regulator circuit 603 (e.g., to the node 539) to obtain a signal at the control terminal 172, and a drain terminal 724 adapted to be coupled to the ground node 145 (e.g., through a resistor).

The third transistor 706 includes a control terminal 726 coupled to the drain terminal 724 of the second transistor 704, a drain terminal 728 coupled to the output terminal 620A, 620B of the linear regulator circuit 603 to provide an output of the linear regulator circuit 603, and a source terminal 730 adapted to be coupled to the ground node 145. The second resistor 710 is coupled between the control terminal 726 of the third transistor 706 and the ground node 145. The third resistor 712 is coupled and/or adapted to be coupled between the first voltage source node 516 and the drain terminal 728 of the third transistor 706. The linear regulator circuit 603 regulates the voltage at the node 539 (e.g., at the control terminal 172) by varying the regulation signal (e.g., a current) through the transistor 604 responsive to a voltage at the second input terminal 622 (e.g., at the node 539, at the control terminal 172) exceeding a voltage (VCLAMP) provided by the clamp voltage source node 605. Thus, the linear regulator circuit 603 regulates the first control signal (e.g., the current) provided by the first stage 510 such that the voltage at the control terminal 172 is regulated and/or does not exceed a voltage. Therefore, advantageously, the transistor 150 can be prevented from damage due to the first stage 510 driving (e.g., enabling) the transistor 150.

The comparator circuit 602 (e.g., a comparator, delay, and/or latching circuit) is coupled to the logic gate 601, the linear regulator circuit 603, and the third output terminal 528 of the regulator 505. The input terminal 629 of the comparator circuit 602 is coupled to the control terminal 625 of the transistor 604 (e.g., to the output terminal 620A of the linear regulator circuit 603) to obtain an output signal from the linear regulator circuit 603. The comparator circuit 602 is adapted to provide the second trigger signal to the second stage 515 (e.g., enable the transistor 635) responsive to the voltage at the input terminal 629 exceeding a voltage threshold (e.g., a reference voltage for the comparator circuit 602) for a period of time. The comparator circuit 602 may also provide a logic low value at the second output terminal 631 (e.g., to the logic gate 601 at the second input terminal 617) to vary the first trigger signal and/or disable the first stage 510.

The transistor 604 includes the drain terminal 624 coupled to the second output terminal 526 (e.g., to the second input terminal 532, to the third terminal 638), the source terminal 623 adapted to be coupled to the first voltage source node 516, and the control terminal 625 coupled to the output terminal 620B of the linear regulator circuit 603. The transistor 604 can respond to the output from the linear regulator circuit 603 (e.g., at the control terminal 625) by providing the regulation signal to the first stage 510 at the second output terminal 526. In operation, if the voltage at the second input terminal 522 exceeds the voltage VCLAMP (e.g., if the voltage at the second input terminal 622 exceeds the voltage at the first input terminal 621), the linear regulator circuit 603 increases the current through the transistor 604 (e.g., from the source terminal 623 to the drain terminal 624). Thus, the current obtained by the current mirror circuit 634 at the first terminal 640 is lower than that previously obtained, and, therefore, the current provided by the current mirror circuit 634 at the second terminal 642 is decreased. As a result, the voltage at the second input terminal 522 is decreased and begins to approach the voltage VCLAMP.

The first stage 510 includes the switching circuit 633 and the current mirror circuit 634 of FIG. 6. In the topology of FIG. 7A, the switching circuit 633 is implemented as an NMOS transistor. For example, a control terminal of the NMOS transistor can be coupled to the first terminal 636, a source terminal of the NMOS transistor can be coupled to the second terminal 637, and a drain terminal of the NMOS transistor can be coupled to the third terminal 638. However, any other circuits may additionally or alternatively be included to implement the switching circuit 633. The switching circuit 633 includes the first terminal 636 coupled to the first input terminal 530, the third terminal 638 coupled to the first terminal 640 of the current mirror circuit 634, and the second terminal 637 adapted to be coupled to the current source node 632.

The current mirror circuit 634 includes a fourth transistor 732 and a fifth transistor 734. In the topology of FIG. 7A, the fourth transistor 732 and the fifth transistor 734 each are PMOS transistors. The fourth transistor 732 includes a source terminal 736 adapted to be coupled to the first voltage source node 516, a drain terminal 738 coupled to the first terminal 640 of the current mirror circuit 634, and a control terminal 740 coupled to the first terminal 640. The fifth transistor 734 includes a control terminal 742 coupled to the control terminal 740 of the fourth transistor 732, a source terminal 744 adapted to be coupled to the first voltage source node 516, and a drain terminal 746 coupled to the second terminal 642 of the current mirror circuit 634. In operation, the current mirror circuit 634 provides the first control signal at the second terminal 642 to the output terminal 158 (e.g., to the node 539, to the transistor 150, etc.) responsive to obtaining a signal (such as a mirror signal, a current mirror signal) at the first terminal 640. For example, the switching circuit 633 and the transistor 604 can be enabled to provide a mirror current (such as the signal IDRV) to the first terminal 640 sourced by the current source 632, and the current mirror circuit 634 can then provide the first control signal to the control terminal 172. In some examples, a second current mirror circuit can be coupled between the second terminal 642 and the output terminal 534 of the first stage 510 (such as between the second terminal 642 and the node 539) to provide additional current to enable the transistor 150.

The second stage 515 includes the transistor 635 of FIG. 6. The transistor 635 is coupled to the input terminal 536 of the second stage 515 (e.g., to the third output terminal 528 of the regulator 505) and to the output terminal 538 (e.g., to the node 539, to the output terminal 158, to the transistor 150, etc.). The transistor 635 can enable the transistor 150 by providing the second control signal, such as a current provided by the second voltage source node 518, responsive to obtaining the second trigger signal at the input terminal 536.

Figure 7B:
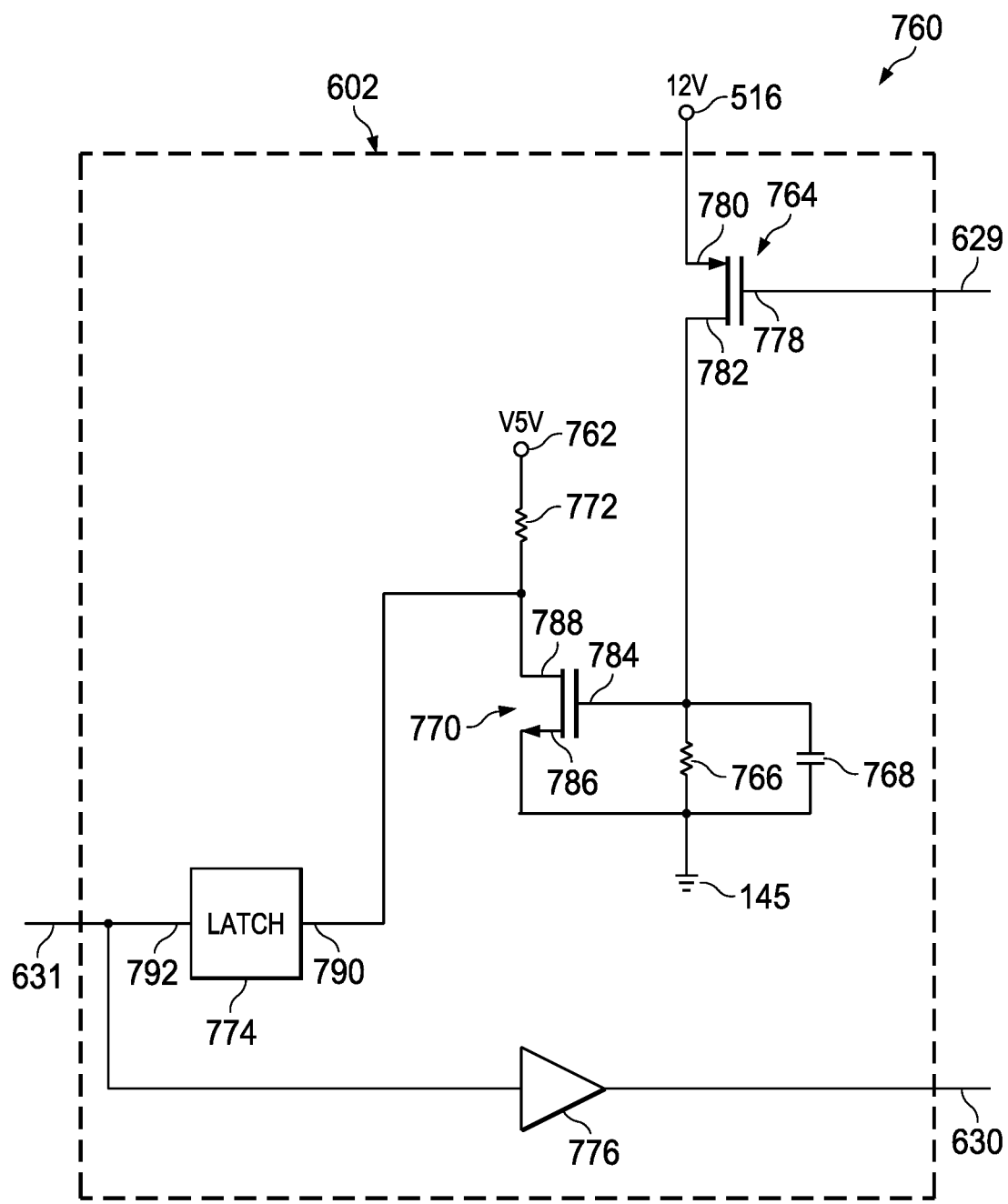

FIG. 7B is a diagram of an example implementation 760 of the comparator circuit 602 (e.g., a comparator, delay, and latching circuit) of FIG. 6. The implementation 760 includes the ground node 145 of FIG. 1, the first voltage source node 516 of FIG. 5, and a supply voltage node (V5V) 762 (e.g., a digital supply voltage node). In the example of FIG. 7B, the comparator circuit 602 includes a first transistor 764, a first resistor 766, a capacitor 768, a second transistor 770, a second resistor 772, a latching circuit 774, and a buffer circuit 776. In some examples, the comparator circuit 602 can be adapted to be coupled to the supply voltage node 762 and/or the first voltage source node 516. In the example of FIG. 7B, the supply voltage node 762 provides a voltage of five volts. However, the supply voltage node 762 may provide any suitable supply voltage (e.g., 3.3 volts) to the comparator circuit 602.

The first transistor 764 includes a control terminal 778 coupled to the input terminal 629 of the comparator circuit 602 to obtain an output from the linear regulator circuit 603, a source terminal 780 adapted to be coupled to the first voltage source node 516, and a drain terminal 782. In the topology of FIG. 7B, the first transistor 764 is a PMOS transistor. In operation, the first transistor 764 provides a signal (e.g., a current) at the drain terminal 782 responsive to a signal at the control terminal 778 (e.g., at the input terminal 629). For example, if the linear regulator circuit 603 decreases an output signal provided at the output terminal 620 responsive to the voltage at the second input terminal 622 exceeding the voltage VCLAMP at the first input terminal 621, the first transistor 764 can increase a current signal provided at the drain terminal 728 using the first voltage source node 516.

In the illustrated example of FIG. 7B, the first resistor 766 and the capacitor 768 are each coupled between the drain terminal 782 and the ground node 145. In operation, the first resistor 766 and the capacitor 768 can form a filter circuit (e.g., a low pass filter circuit), and the filter circuit can delay the enablement of the second transistor 770 responsive to the current signal provided by the first transistor 764. For example, once the first transistor 764 is enabled, the second transistor 770 can be enabled responsive to the first transistor 764, and the second transistor 770 can be enabled after a delay based on the impedance of the first resistor 766 and the capacitor 768.

The second transistor 770 includes a control terminal 784 coupled to the drain terminal 782 of the first transistor 764, a source terminal 786 adapted to be coupled to the ground node 145, and a drain terminal 788 adapted to be coupled to the supply voltage node 762 (e.g., through a resistor). In the topology depicted in FIG. 7B, the second transistor 770 is an NMOS transistor. The second resistor 772 is coupled between the drain terminal 788 and the supply voltage node 762. The latching circuit 774 includes an input terminal 790 coupled to the drain terminal 788 of the second transistor 770 and an output terminal 792 to provide an output signal (e.g., a logic low value) to the logic gate 601. The latching circuit 774 sets (e.g., latches) a voltage signal at the output terminal 792 responsive to the voltage obtained at the input terminal 790. For example, if the voltage at the input terminal 790 decreases (such as a transition from a logic high value to a logic low value), the latching circuit 774 may maintain a voltage (such as a logic low value) at the output terminal 792 until a next cycle. The output terminal 792 of the latching circuit 774 is coupled to the second output terminal 631 of the comparator circuit 602.

The buffer circuit 776 is coupled between the output terminal 792 of the latching circuit 774 and the first output terminal 630 of the comparator circuit 602. In the example of FIG. 7B, the buffer circuit 776 removes glitches (e.g., unnecessary signal transitions) from the voltage signal obtained from the output terminal 792 of the latching circuit 774 and provides the voltage signal to coupled components at the output terminal 630 of the comparator circuit 602 (e.g., the transistor 635 of the second stage 515) at a lower output impedance level than the output impedance level of the latching circuit 774. While the topology of FIG. 7B includes one buffer circuit, any number of buffer circuits may additionally or alternatively be included in the comparator circuit 602 and/or, more generally, the driver 105. For example, a buffer circuit may be coupled between the output terminal 792 of the latching circuit 774 and the output terminal 631 of the comparator circuit 602.

In operation, in an initial state (e.g., when the first driver 105 is commanded to turn on responsive to the signal IN obtained at the input terminal 156), the comparator circuit 602 provides a first voltage signal (e.g., a logic high value) at the first output terminal 630 and the second output terminal 631. Responsive to a variation in the signal obtained at the input terminal 629 (e.g., the linear regulator circuit 603 decreases a voltage signal at the output terminal 620 responsive to the voltage at the second input terminal 622 exceeding the voltage at the first input terminal 621), the first transistor 764 is enabled. Thus, the second transistor 770 is enabled after a delay controlled by the filter circuit (e.g., the first resistor 766 and the capacitor 768). As a result, a low voltage signal is provided to the latching circuit 774 at the input terminal 790, and the latching circuit 774 varies the output (e.g., provides a logic low value) at the output terminal 792. Responsive to the variation at the output terminal 792, and therefore the variation at the first output terminal 630 and the second output terminal 631, the second stage 515 is enabled, and first stage 510 is disabled. The latching circuit 774 ensures that the driver 105 remains in this state (e.g., with the second stage 515 enabled and the first stage 510 disabled) until the first driver 105 is commanded to be disabled responsive to a change in (e.g., a decrease in) the signal IN obtained at the input terminal 156.

Figure 8:
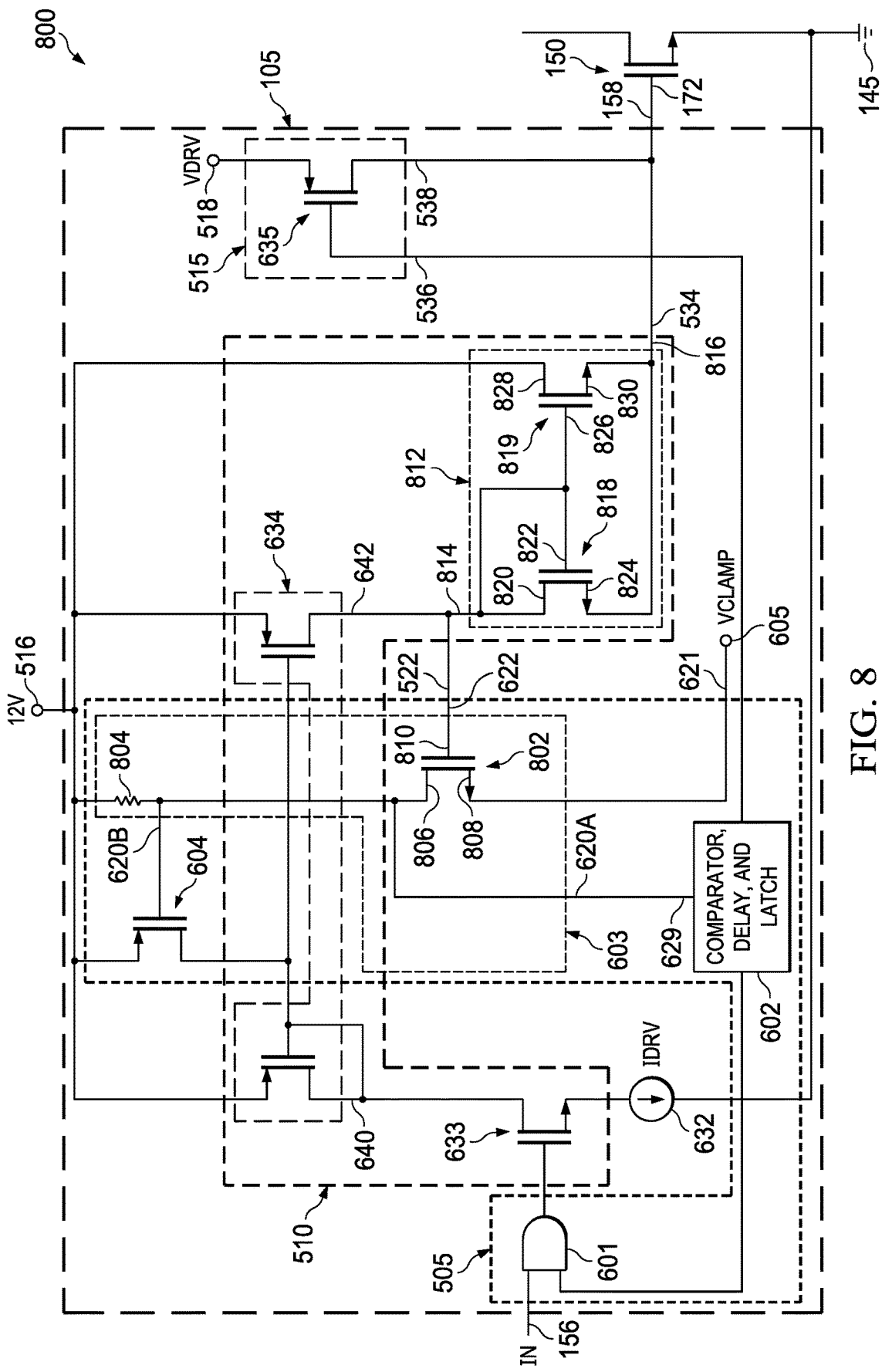
FIG. 8 is a diagram of an example implementation of the first driver of FIGS. 1, 5, and/or 6, including additional logic circuitry to the implementation depicted in FIG. 6.

FIG. 8 is a diagram of an example implementation 800 of the driver 105 of FIGS. 1, 5, and/or 6 including additional logic circuitry to the implementation of FIG. 6. The implementation 800 includes the driver 105, the ground node 145, the transistor 150, the input terminal 156, and the output terminal 158 of FIG. 1. In the example of FIG. 8, the driver 105 includes the regulator 505, the first stage 510, the second stage 515, the first voltage source node 516, and the second voltage source node 518 of FIG. 5. In the topology of FIG. 8, the driver 105 includes the clamp voltage source node 605 and the current source node 632 of FIG. 6.

In the illustrated example of FIG. 8, the regulator 505 includes the logic gate 601, the comparator circuit 602, the linear regulator circuit 603, and the transistor 604. In the example of FIG. 8, the linear regulator circuit 603 includes a transistor 802 and a resistor 804. The transistor 802 includes a drain terminal 806 coupled to the output terminal 620 (e.g., the output terminal 620A, 620B) of the linear regulator circuit 603 (e.g., to the input terminal 629 of the comparator circuit 602), a source terminal 808 coupled to the first input terminal 621 (e.g., adapted to be coupled to the clamp voltage source node 605), and a control terminal 810 coupled to the second input terminal 622. The resistor 804 is coupled and/or adapted to be coupled between the drain terminal 806 of the transistor 802 and the first voltage source node 516. In operation, the linear regulator circuit 603 regulates the voltage at the node 539 (e.g., at the output terminal 534 of the first stage 510, at the second input terminal 522, etc.) to approach the voltage VCLAMP provided by the clamp voltage source node 605.

In the illustrated example of FIG. 8, the first stage 510 includes the switching circuit 633 and the current mirror circuit 634 of FIG. 6. In the topology of FIG. 8, the switching circuit 633 is implemented as an NMOS transistor. However, any other circuits may additionally or alternatively be included to implement the switching circuit 633. In the example of FIG. 8, the first stage 510 includes a second current mirror circuit 812. The second current mirror circuit 812 includes a first terminal 814 coupled to the second terminal 642 of the current mirror circuit 634 and to the second input terminal 522 of the regulator 505 to obtain a signal (e.g., a current) from the current mirror circuit 634, and the second current mirror circuit 812 includes a second terminal 816 coupled to the output terminal 534 of the first stage (e.g., to the output terminal 158 and/or to the control terminal 172 of the transistor 150) to provide a control signal to, and thus enable, the transistor 150.

The second current mirror circuit 812 includes a first transistor 818 and a second transistor 819. The first transistor 818 includes a drain terminal 820 coupled to the first terminal 814 to obtain a current signal from the first current mirror circuit 634, a control terminal 822 coupled to the drain terminal 820, and a source terminal 824 coupled to the second terminal 816 of the second current mirror circuit 812 to provide a control signal to the control terminal 172. The second transistor 819 includes a control terminal 826 coupled to the control terminal 822 of the first transistor 818 to obtain the current signal from the first current mirror circuit 634, a drain terminal 828 adapted to be coupled to the first voltage source node 516, and a source terminal 830 coupled to the second terminal 816 of the second current mirror circuit 812 to provide the control signal to the control terminal 172. In some examples, the current mirror circuit 634 can provide a current signal at the second terminal 642 (such as at the first terminal 814 of the second current mirror circuit 812) responsive to a signal obtained at the first terminal 640, such as the signal IDRV when the switching circuit 633 is enabled by the regulator 505. The second current mirror circuit 812 may then provide the second control signal at the second terminal 816 (e.g., at the output terminal 534, to the transistor 150) responsive to obtaining the signal at the first terminal 814. In some examples, the second current mirror circuit 812 can provide additional current to enable the transistor 150 compared to the current mirror circuit 634, and/or the second current mirror circuit 812 can stabilize the current signal provided by the current mirror circuit 634 at the second terminal 642.

The second stage 515 includes the transistor 635 of FIG. 6. The transistor 635 is coupled to the input terminal 536 and to the output terminal 538 of the second stage 515. The transistor 635 enables the transistor 150 by providing the second control signal, such as a current provided by the second voltage source node 518, responsive to obtaining the second trigger signal at the input terminal 536.

While an example manner of implementing the driver 105 of FIG. 1 is illustrated in FIGS. 5, 6, 7A, 7B, and/or 8, one or more of the elements, processes and/or devices illustrated in FIGS. 5, 6, 7A, 7B, and/or 8 may be combined, divided, re-arranged, omitted, eliminated and/or implemented in any other way. Further, the example regulator 505, the example first stage 510, the example second stage 515, and/or, more generally, the example driver 105 of FIGS. 1, 5, 6, 7A, 7B, and/or 8 may be implemented by hardware, software, firmware and/or any combination of hardware, software and/or firmware. Thus, for example, any of the example regulator 505, the first example stage 510, the second example stage 515, and/or, more generally, the example driver 105 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example regulator 505, the first example stage 510, the second example stage 515, and/or, more generally, the example driver 105 is/are hereby expressly defined to include a non-transitory computer readable storage device or storage disk such as a memory, a digital versatile disk (DVD), a compact disk (CD), a Blu-ray disk, etc. including the software and/or firmware. Further still, the example driver 105 of FIG. 1 may include one or more elements, processes and/or devices in addition to, or instead of, those illustrated in FIGS. 5, 6, 7A, 7B, and/or 8, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 9:
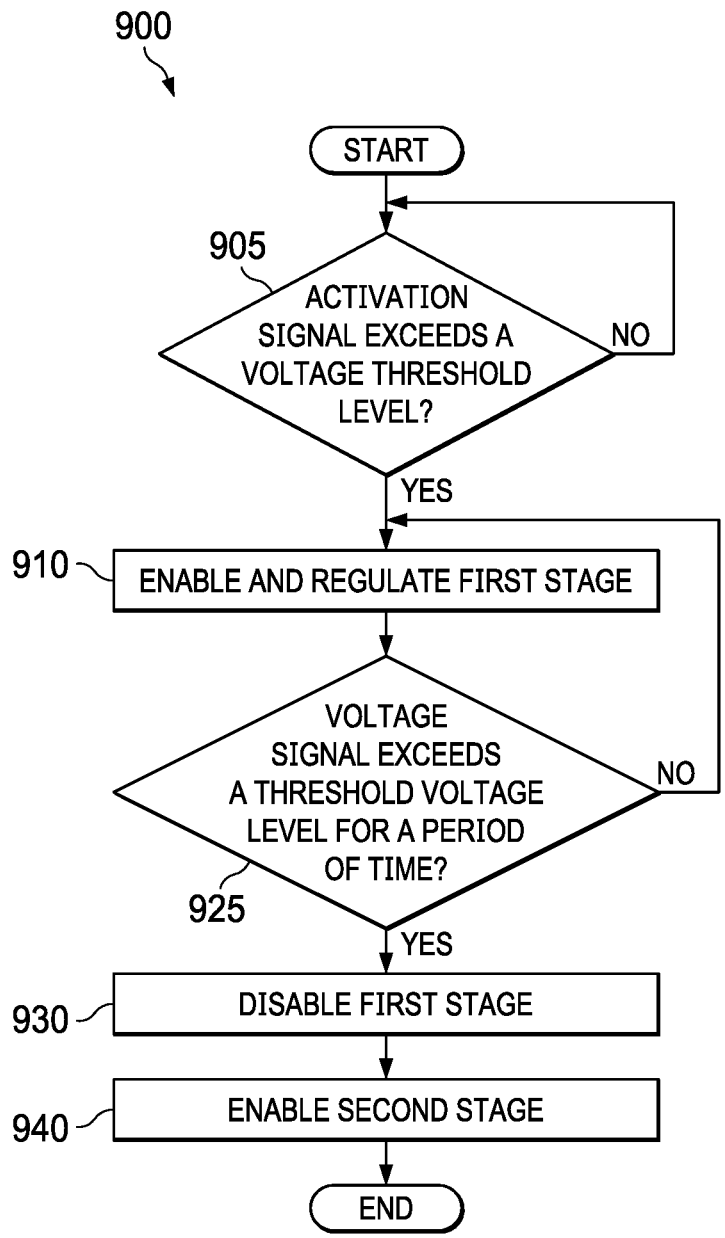
FIG. 9 is a flowchart representative of an example process that may be implemented using logic or machine readable instructions that may be executed to implement an example driver.

A flowchart representative of example hardware logic, machine readable instructions, hardware implemented state machines, and/or any combination thereof for implementing the example driver 105 of FIG. 1 is shown in FIG. 9. The machine readable instructions may be one or more executable programs or portion(s) of an executable program for execution by a computer processor such as a processor. The program may be embodied in software stored on a non-transitory computer readable storage medium such as a CD-ROM, a floppy disk, a hard drive, a DVD, a Blu-ray disk, or a memory associated with a processor, but the entire program and/or parts thereof could alternatively be executed by a device other than a processor and/or embodied in firmware or dedicated hardware. Further, although the example program is described with reference to the flowchart illustrated in FIG. 9, many other methods of implementing the example driver 105 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C #, Perl, Python, JavaScript, HyperText Markup Language (HTML), Structured Query Language (SQL), Swift, etc.

As mentioned above, the example process of FIG. 9 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

FIG. 9 is a flowchart representative of an example process 900 that may be implemented using logic or machine readable instructions that may be executed to implement an example driver (e.g., the driver 105 of FIGS. 1, 5, 6, 7A, 7B, and/or 8). In the example process 900 of FIG. 9, the regulator 505 obtains the activation signal (such as the signal IN) and determines whether the activation signal exceeds a voltage threshold level (such as a logic high voltage threshold, a threshold of five volts, a threshold of three volts). If the regulator 505 determines that the activation signal does not exceed the voltage threshold level (e.g., block 905 returns a result of NO), control returns to block 905, and the regulator 505 obtains the activation signal.

If the regulator 505 determines that the activation signal exceeds (e.g., satisfies, meets, is greater than) the voltage threshold level (e.g., block 905 returns a result of YES), the regulator 505 enables and regulates the first stage 510. (Block 910). In some examples, the regulator 505 provides the first trigger signal at the first output terminal 524 (e.g., to the first terminal 636 of the switching circuit 633) to enable the first stage 510. The first stage 510 obtains the first trigger signal. The first stage 510 provides the first control signal at the output terminal 534 responsive to the first trigger signal. Thus, the transistor 150 is enabled (e.g., conducting) with a current provided by the first voltage source node 516.

In some examples, the regulator 505 may be adapted to regulate the first stage 510 responsive to a voltage signal obtained at the node 539 by providing and/or varying a regulation signal at the second output terminal 526. For example, if the linear regulator circuit 603 determines that the voltage at the second input terminal 522 (such as at the node 539, at the control terminal 172) exceeds a voltage threshold (such as VCLAMP provided by the clamp voltage source node 605), the linear regulator circuit 603 and/or the transistor 604 may regulate the voltage at the node 539. Thus, the signal provided to the current mirror circuit 634 may vary (e.g., decrease). In some examples, the regulator 505 may be adapted to regulate a voltage at the control terminal 172, at the second input terminal 522, etc., by providing the regulation signal at the second output terminal 526. The regulator 505 may adjust the output (e.g., first control signal) provided by the first stage 510 such that the output at the node 539 to the control terminal 172 does not exceed normal operating conditions for a long period of time and/or damage the transistor 150.

The regulator 505 obtains the voltage signal at the second input terminal 522 (e.g., a voltage of the node 539 and/or a voltage of the control terminal 172). If the regulator 505 determines that the voltage signal exceeds a threshold (e.g., VCLAMP provided by the clamp voltage source node 605) for a period of time (e.g., block 925 returns a result of YES), the regulator 505 disables the first stage 510. (Block 930). The regulator 505 then enables the second stage 515. (Block 940). For example, if the comparator circuit 602 determines that the output of the linear regulator circuit 603 is activated (e.g., is enabled, is providing an output) for a period of time, the comparator circuit 602 may provide a logic low value to the second input terminal 617 of the logic gate 601 and provide the second trigger signal to the second stage 515 at the third output terminal 528.

Thus, the logic gate 601 varies (e.g., lowers) the first trigger signal provided to the first input terminal 530 of the first stage 510, and the switching circuit 633 is disabled. Therefore, the current mirror circuit 634 varies (e.g., lowers, ceases to provide) the first control signal. Further, responsive to the second trigger signal, the transistor 635 of the second stage 515 is enabled and provides the second control signal to the control terminal 172. Thus, the transistor 150 is enabled by the second stage 515. If the regulator 505 determines that the voltage signal (e.g., the voltage at the control terminal 172) does not exceed a threshold voltage level for a period of time (e.g., block 925 returns a result of NO), the regulator 505 enables and regulates the first stage 510. (Block 910).

Figure 10:
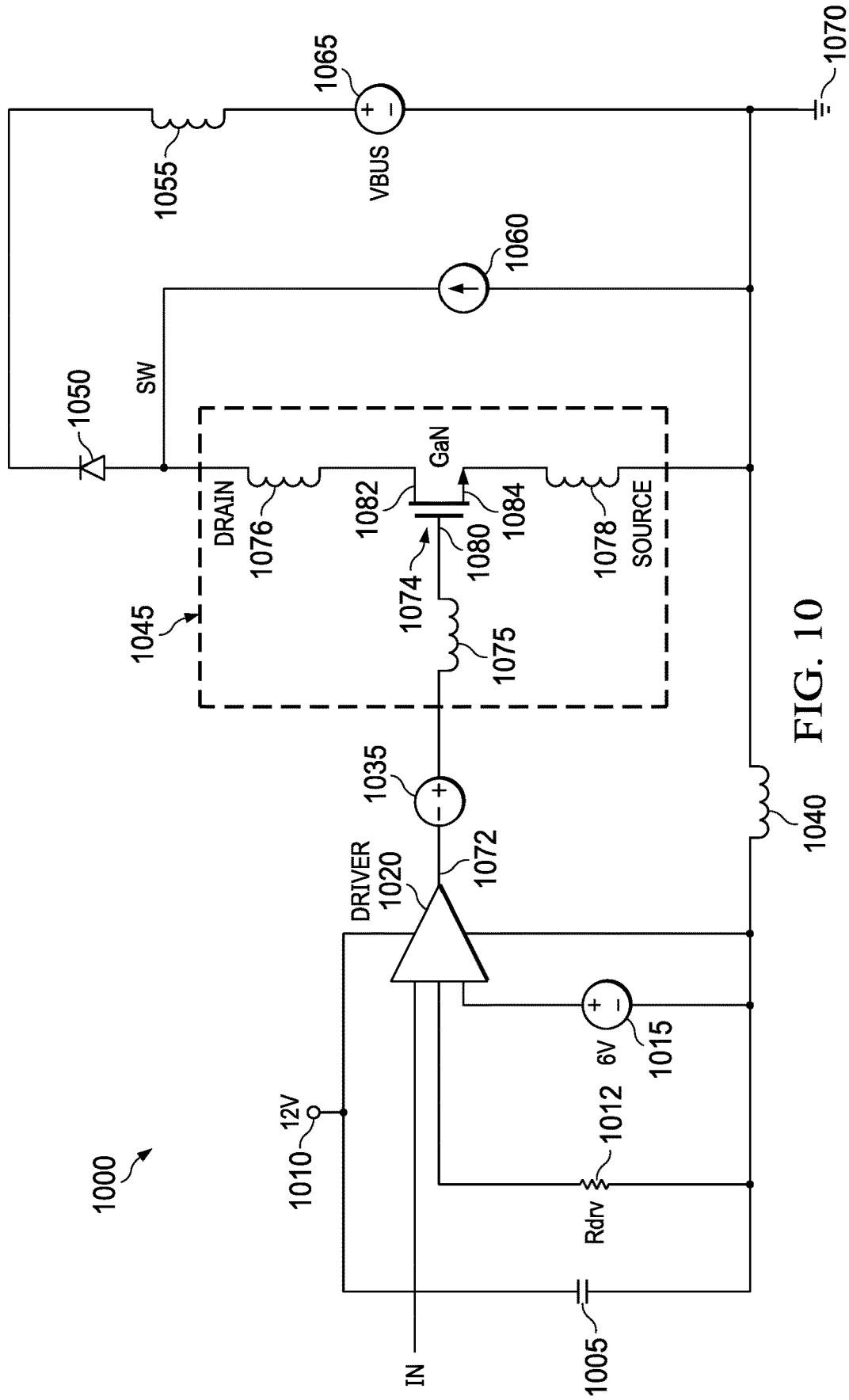
FIG. 10 is a schematic illustration of an example simulation bench of a driver in an example power converter.

FIG. 10 is a schematic illustration of an example simulation bench 1000 (e.g., a test bench, a circuit, etc.) of a driver in a power converter (e.g., the driver 105 of FIGS. 5, 6, 7A, 7B, and/or 8, the driver 205 of FIG. 2, the driver 305 of FIG. 3, the driver 402 of FIG. 4, etc.). The simulation bench 1000 may be used to verify the functionality of a driver, such as the driver 105 of FIG. 1, to enable a transistor model using multiple stages, such as the first stage 510 and the second stage 515 of FIG. 5. In some examples, the simulation bench 1000 may demonstrate the advantages of the driver 105 of FIGS. 5, 6, 7A, 7B, and/or 8 over the driver 205 of FIG. 2, the driver 305 of FIG. 3, and/or the driver 402 of FIG. 4, as discussed below in connection with FIGS. 11-14. The simulation bench 1000 includes a capacitor 1005, a first voltage source node 1010, a resistor (Rdrv) 1012, a second voltage source 1015, a driver 1020 (e.g., the driver 105 of FIGS. 1, 5, 6, 7A, 7B, and/or 8, the driver 205 of FIG. 2, the driver 305 of FIG. 3, the driver 402 of FIG. 4), a third voltage source 1035, a first inductor 1040, a transistor model 1045, a diode 1050, a second inductor 1055, a current source 1060, a fourth voltage source (VBUS) 1065, and a ground node 1070. The driver 1020 includes an output terminal 1072. In the example of FIG. 10, the first voltage source node 1010 provides twelve volts to represent the first voltage source node 516, and the second voltage source node 1015 provides six volts to represent the second voltage source node 518. However, any of the voltage sources/voltage source node 1010, 1015, 1035, 1065 may provide any suitable voltage. In the example of FIG. 10, the clamp voltage source is generated within the driver 1020, and, thus, the clamp voltage source node 605 is included within the driver 1020.

The capacitor 1005 is coupled between the first voltage source node 1010 and the first inductor 1040. The resistor (Rdrv) 1012 is coupled between the driver 1020 and the first inductor 1040. In some examples, the impedance of the resistor 1012 may affect the amplitude of the current provided by a current source in a driver, such as the current source 632 in the driver 105 of FIG. 6. In some examples, the resistor (Rdrv) 1012 may adjust the fast pullup gate drive current (e.g., IDRV, the current provided by the first stage 510) to set the slew rate of a transistor 1074 included in the transistor model 1045. The second voltage source 1015 is coupled between the driver 1020 and the first inductor 1040. The first inductor 1040 is coupled between the driver 1020 and the ground node 1070. The driver 1020 is adapted to be coupled to the first voltage source node 1010 and to the second voltage source 1015. The driver 1020 is adapted to obtain an activation signal (e.g., the signal IN) and provide (e.g., output) one or more control signals to enable the transistor model 1045. In some examples, the first voltage source node 1010 may be the first voltage source node 516 of FIG. 5, and the second voltage source 1015 may be the second voltage source node 518 of FIG. 5.

The third voltage source node 1035 is coupled between the driver 1020 and the transistor model 1045. In some examples, the third voltage source node 1035 may represent a voltage applied to a gate of a transistor, such as a control terminal of a transistor included in the transistor model 1045. In some examples, the third voltage source node 1035 may shift the gate voltage (e.g., the voltage at a control terminal of the transistor 1074) to vary the headroom provided by the driver 1020 and determine the effect of the headroom on the gate current and the slew rate of the transistor 1074, as discussed below in connection with FIGS. 11, 12, 13, and/or 14. In some examples, a more negative voltage shift by the third voltage source node 1035 decreases the voltage required to drive the transistor 1074 ($V_{gs}$), and, thus, as shown above in Equation 1, the driver 1020 is able to provide more headroom to the transistor 1074 with a constant supply source voltage (such as the first voltage source node 1010, the first voltage source node 516 of FIG. 5). The voltage shift by the third voltage source 1035 (e.g., a method of gaining the headroom of the transistor 1074) may be difficult (possibly, it may not be possible) to implement; however, the voltage shift may be realized with a simulation test of the simulation bench 1000 to demonstrate an example performance of the driver 1020.

The example transistor model 1045 includes the transistor 1074, a third inductor 1075, a fourth inductor 1076, and a fifth inductor 1078. In the example of FIG. 10, the transistor 1074 is an NMOS transistor. The transistor 1074 includes a control terminal 1080, a drain terminal 1082, and a source terminal 1084. The third inductor 1075 is coupled between the third voltage source node 1035 and the control terminal 1080, the fourth inductor 1076 is coupled between the drain terminal 1082 and the diode 1050, and the fifth inductor 1078 is coupled between the source terminal 1084 and the ground node 1070. In some examples, the transistor model 1045 may represent a transistor such as the transistor 150 of FIG. 1. Thus, the inductors 1075, 1076, 1078 may represent internal inductance in the transistor 150. For example, the third inductor 1075 may represent gate inductance of the transistor 1074, the fourth inductor 1076 may represent drain inductance of the transistor 1074, and the fifth inductor 1078 may represent source inductance of the transistor 1074.

In the illustrated example of FIG. 10, the diode 1050 is coupled between the fourth inductor 1076 and the second inductor 1055. In some examples, the diode 1050 may restrict current flow towards the drain terminal 1082. The current source node 1060 is coupled between the fourth inductor 1076 and the ground node 1070. The second inductor 1055 is coupled between the diode 1050 and the fourth voltage source node 1065. The fourth voltage source node 1065 is coupled between the second inductor 1055 and the ground node 1070. In some examples, the fourth voltage source node 1065 may provide a signal (such as a voltage VBUS) to represent a voltage supplying a power converter including the driver 1020, such as the bus voltage node 140 of FIG. 1.

Figure 11:
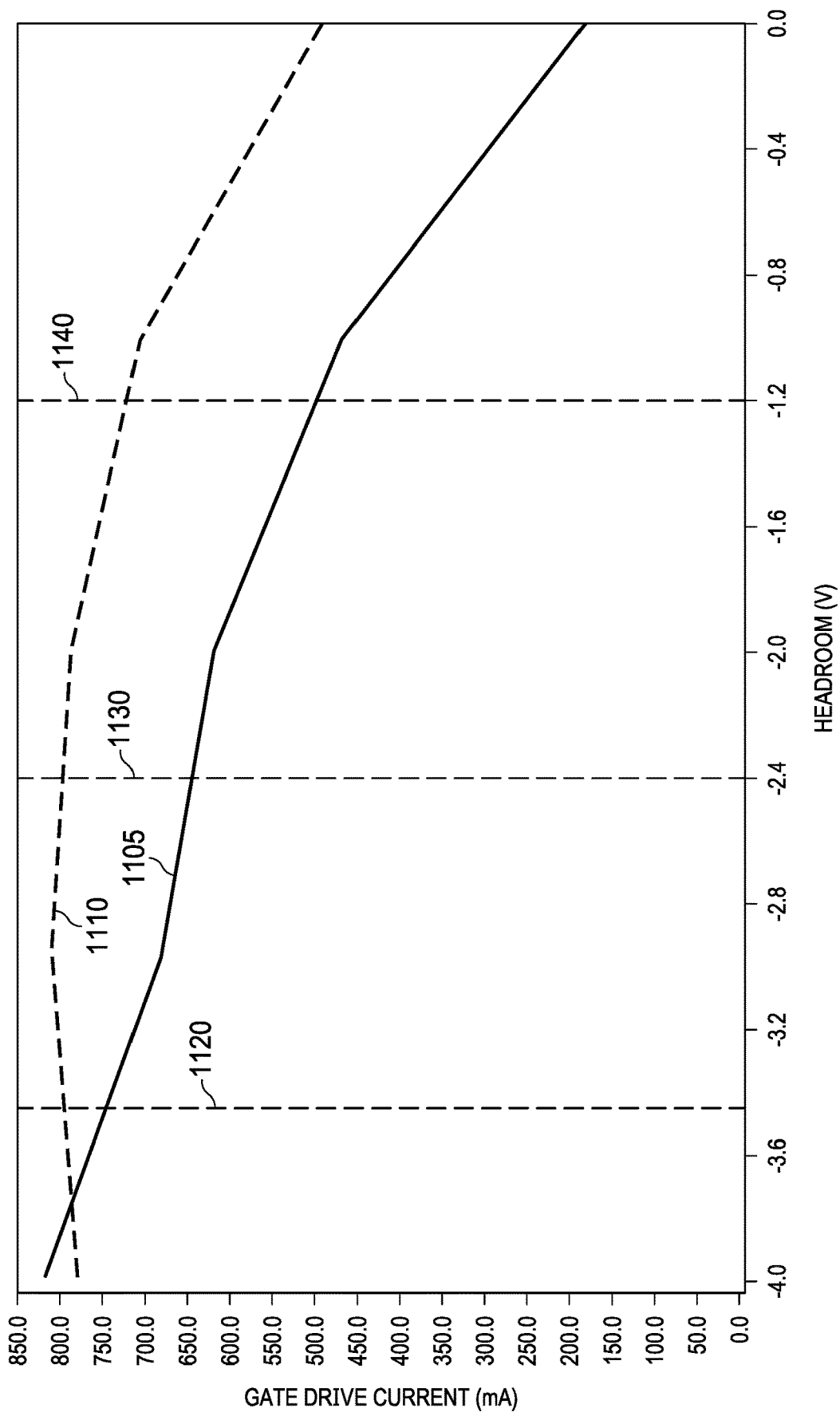
FIG. 11 is a signal plot depicting a first current signal of a first transistor enabled by a first driver and a second current signal of a second transistor enabled by a second driver in a power conversion system at various voltage offsets.

FIG. 11 is a signal plot 1100 depicting a first current signal of a first transistor enabled by a first driver and a second current signal of a second transistor enabled by a second driver in a power conversion system at various voltage offsets (e.g., transistor headrooms). The signal plot 1100 of FIG. 11 includes a first example current signal (line 1105) and a second example current signal (line 1110). In FIG. 11, the first current signal (line 1105) may represent a current provided to the control terminal of the transistors 210, 310, 404 by the drivers 205, 305, 402 of FIGS. 2, 3, and/or 4, such as the control terminal 436 of the transistor 404 by the driver 402 of FIG. 4, and the second current signal (line 1110) may represent a current provided to the control terminal 172 of the transistor 150 by the driver 105 of FIGS. 5, 6, 7A, 7B, and/or 8.

The signal plot 1100 illustrates a current that may be applied to (e.g., adapted to enable, be provided to, be obtained by, etc.) a control terminal of a transistor at various voltage headrooms provided at the control terminal. For example, the second current signal (line 1110) illustrates a voltage of the control terminal 172 of the transistor 150 at which a current may be provided to the control terminal 172 to enable the transistor 150. The voltage offset may be applied to a transistor (e.g., the transistor 1074) with a source voltage (e.g., a voltage provided by the third voltage source 1035). Thus, the voltage offset provided at the control terminal determines the headroom of the transistor. In the example of FIG. 11, a more negative headroom value (e.g., voltage offset) indicates additional headroom provided to the transistor compared to less negative headroom values.

At a first example voltage offset 1120 of negative 3.48 volts, the first current signal (line 1105) is 750 milliamperes, and the second current signal (line 1110) is 800 milliamperes. At a second example voltage offset 1130 of negative 2.4 volts, the first current signal (line 1105) is 650 milliamperes, and the second current signal (line 1110) is 800 milliamperes. At a third example voltage offset 1140 of negative 1.2 volts, the first current signal (line 1105) is 500 milliamperes and the second current signal (line 1110) is 725 milliamperes. Thus, the signal plot 1100 demonstrates that a current applied to the control terminal of the transistor associated with the second current signal (line 1110) (e.g., the transistor 150) may be greater than a current applied to the control terminal of the transistor associated with the first current signal (line 1105) with the same voltage headroom. Therefore, the driver associated with the second current signal (line 1110), such as the driver 105, may provide a larger gate drive current to a coupled transistor than the driver associated with the first current signal (line 1105), such as when the voltage offset of the transistor is zero volts. Further, the signal plot 1100 demonstrates that the gate current able to be provided by the driver 105 is less sensitive to the headroom of the transistor 150 than the driver represented by the first current signal (line 1105), such as the drivers 205, 305, 402.

Figure 12:
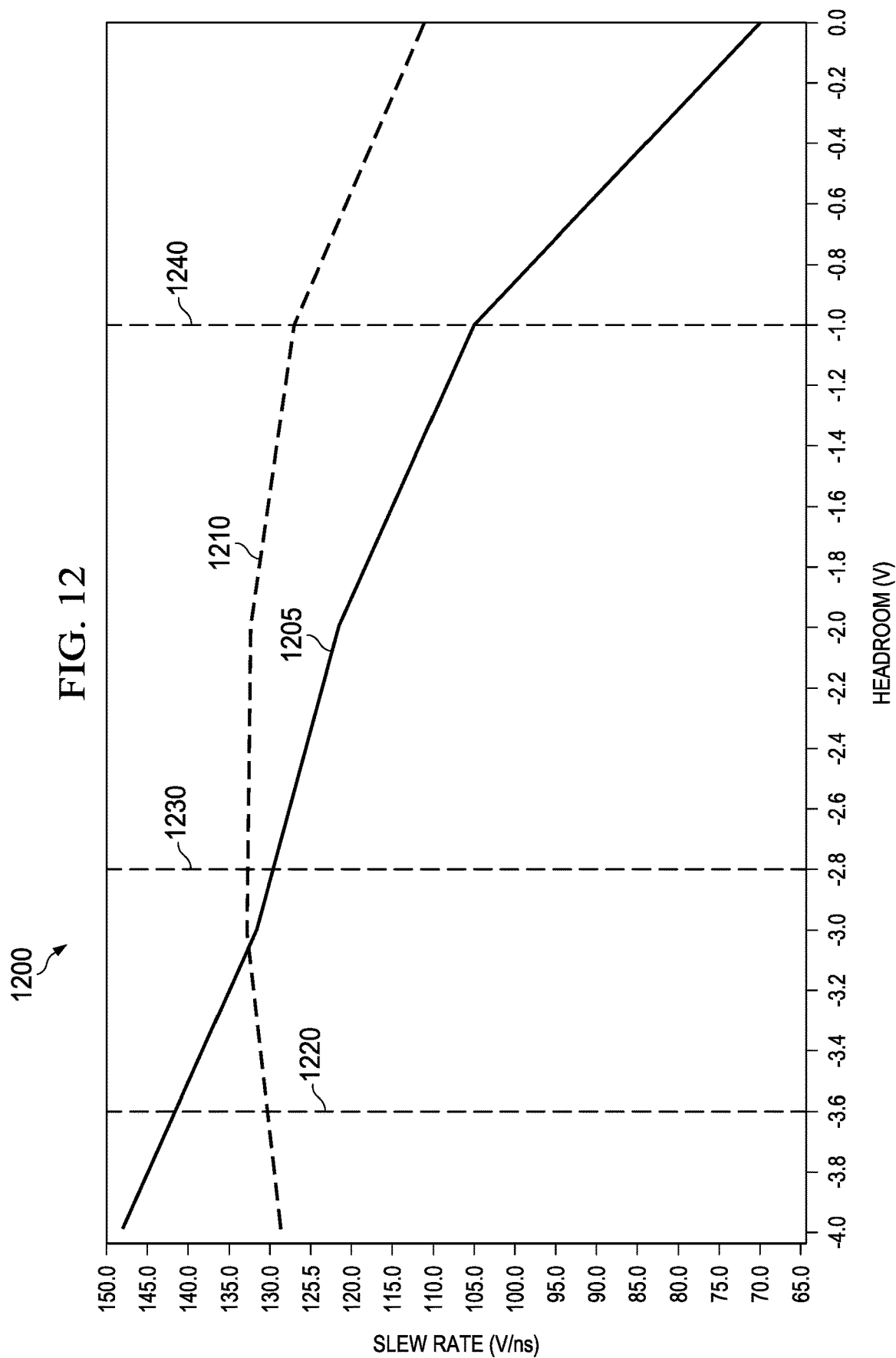
FIG. 12 is a signal plot depicting a first slew rate of a transistor enabled by a first driver and a second slew rate of a transistor enabled by a second driver in a power conversion system at various voltage offsets.

FIG. 12 is a signal plot 1200 depicting a first slew rate of a transistor enabled by a first driver and a second slew rate of a transistor enabled by a second driver in a power conversion system at various voltage offsets (e.g., transistor headrooms). The signal plot 1200 of FIG. 12 includes a first example slew rate (line 1205) and a second example slew rate (line 1210). In FIG. 12, the first slew rate (line 1205) may represent a slew rate associated with a transistor, such as the change in voltage at the drain terminal 438 of the transistor 404, when the transistor 404 is enabled by the driver 402 of FIG. 4. Further, the first slew rate (line 1205) may represent a slew rate associated with the transistor 210 when enabled by the driver 205 of FIG. 2 and/or the transistor 310 when enabled by the driver 305 of FIG. 3. Similarly, in FIG. 12, the second slew rate (line 1210) may represent a slew rate associated with a transistor, such as the change in voltage at the drain terminal 176 of the transistor 150, when the transistor 150 is enabled by the driver 105 of FIGS. 5, 6, 7A, 7B, and/or 8.

The signal plot 1200 illustrates a slew rate that may be associated with a control terminal of a transistor at various voltage offsets provided at the control terminal. For example, the second slew rate (line 1210) may illustrate a change in voltage over time at the drain terminal 176 of the transistor 150 as the transistor is being enabled (such as being activated, transitioning into an on state, etc.) by the driver 105. The voltage offset may be applied to a transistor (e.g., the transistor 1074) through a voltage source node (e.g., the third voltage source 1035). Thus, the voltage offset provided at the control terminal determines the headroom of the transistor. In the example of FIG. 12, a more negative headroom value (e.g., voltage offset) indicates additional headroom provided to the transistor compared to less negative headroom values.

At a first example voltage offset 1220 of negative 3.6 volts, the first slew rate (line 1205) is 142.5 volts per nanosecond, and the second slew rate (line 1210) is 130 volts per nanosecond. In a second example voltage offset 1230 of negative 2.8 volts, the first slew rate (line 1205) is 130 volts per nanosecond, and the second slew rate (line 1210) is 133 volts per nanosecond. At a third example voltage offset 1240 of negative one volt, the first slew rate (line 1205) is 105 volts per nanosecond, and the second slew rate (line 1210) is 127 volts per nanosecond. Thus, the signal plot 1200 demonstrates that a slew rate (e.g., a change in voltage at the drain terminal over a period of time) of the transistor associated with the second slew rate (line 1210) (e.g., the transistor 150) may be greater than a slew rate of a transistor associated with the first slew rate (line 1205) with the same voltage headroom. Therefore, the driver associated with the second slew rate (line 1210) may enable a larger slew rate for a coupled transistor than the driver associated with the first slew rate (line 1205), such as when the voltage offset of the transistor is zero volts, by providing a larger gate drive current into the transistor. Further, the signal plot 1200 illustrates that the slew rate of the driver 105 is less sensitive to headroom than the drivers represented by the first slew rate (line 1205), such as the drivers 205, 305, 402.

Figure 13:
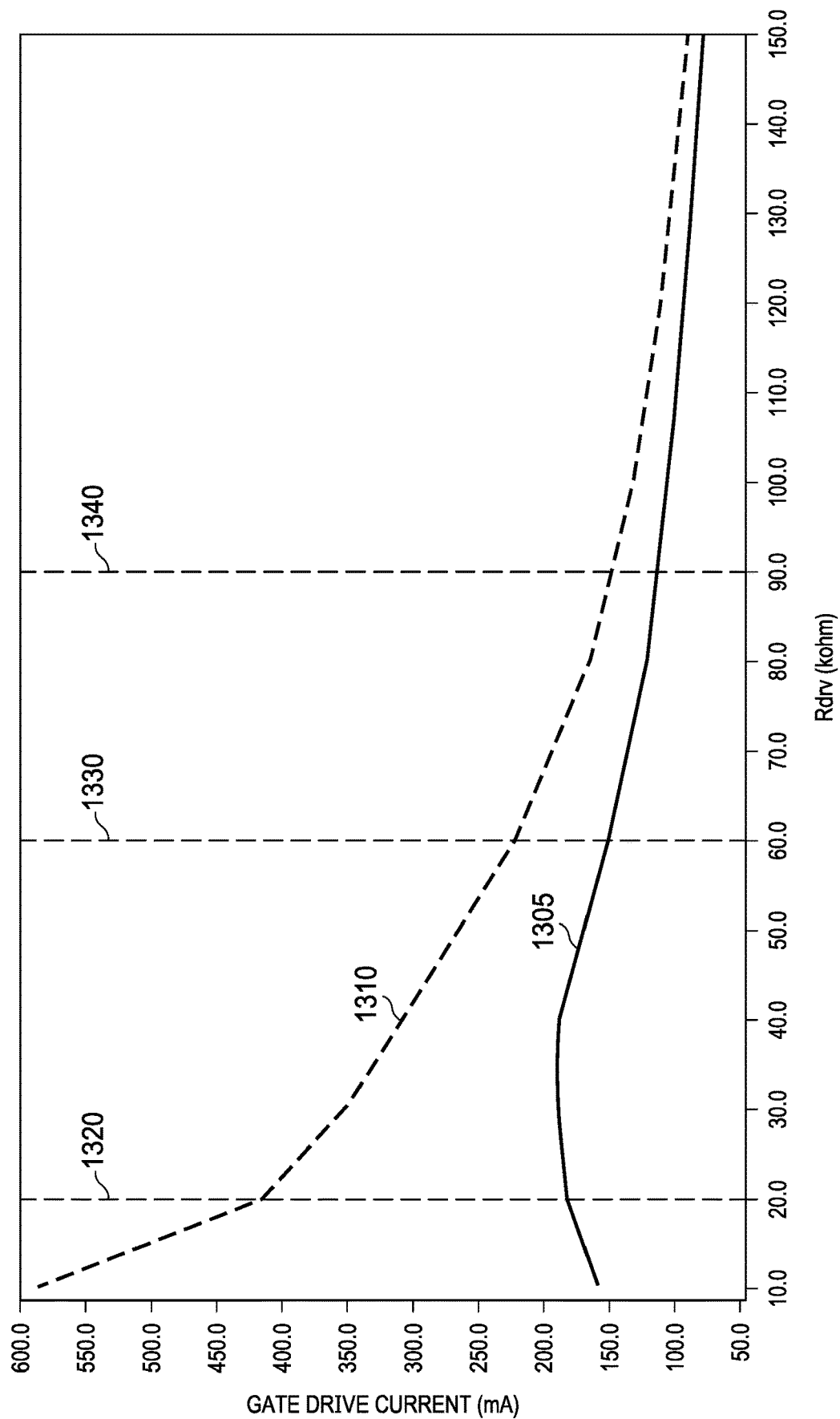
FIG. 13 is a signal plot depicting a first current signal of a transistor enabled by a first driver and a second current signal of a second transistor enabled by a second driver in a power conversion system at various driver resistances.

FIG. 13 is a signal plot 1300 depicting a first current signal of a transistor enabled by a first driver and a second current signal of a second transistor enabled by a second driver in a power conversion system at various driver resistances. The signal plot 1300 of FIG. 13 includes a first example current signal (line 1305) and a second example current signal (line 1310). In FIG. 13, the first current signal (line 1305) may represent a current provided to the control terminal of the transistors 210, 310, 404 by the drivers 205, 305, 402 of FIGS. 2, 3, and/or 4, such as the control terminal 436 of the transistor 404 by the driver 402 of FIG. 4, and the second current signal (line 1310) may represent a current provided to the control terminal 172 of the transistor 150 by the driver 105 of FIGS. 5, 6, 7A, 7B, and/or 8.

The signal plot 1300 illustrates a current that may be applied to a control terminal of a transistor at various impedances (e.g., resistances) of a resistor (Rdrv) coupled to the driver. The resistor (e.g., the resistor 1012 of FIG. 10) may proportionally affect a current provided by a current source (e.g., the current source 632 of FIG. 6) in the driver. For example, the second current signal (line 1310) may illustrate a current provided to the control terminal 172 to enable the transistor 150. In another example, the resistor impedance may be the impedance of the resistor 1012 of FIG. 10, and the resistor 1012 controls the value of the current provided by a current source node (IDRV) included in the driver 1020. In some examples, an adjustment of the resistor (Rdrv) 1012 may adjust a control signal provided by the driver 1020 (such as a control current, the first control signal provided by the first stage 510) and/or may adjust the slew rate of the transistor 1074.

At a first example resistance 1320 of twenty kilohms, the first current signal (line 1305) is 175 milliamperes, and the second current signal (line 1310) is 410 milliamperes. At a second example resistance 1330 of sixty kilohms, the first current signal (line 1305) is 150 milliamperes, and the second current signal (line 1310) is 225 milliamperes. At a third example resistance 1340 of ninety kilohms, the first current signal (line 1305) is 120 milliamperes, and the second current signal (line 1310) is 150 milliamperes. Thus, the signal plot 1300 demonstrates that a current applied to the control terminal of the transistor associated with the second current signal (line 1310) (e.g., the transistor 150) may be greater than a current applied to the control terminal of the transistor associated with the first current signal (line 1305) with the same resistance (e.g., driver resistance value). Therefore, at lower resistance impedances, the headroom of the driver associated with the second current signal (line 1310) is not limited and may provide a higher gate drive current than the driver associated with the first current signal (line 1305). Further, the signal plot 1300 demonstrates that the driver 105 may supply a larger gate current when a high slew rate is desired (e.g., when the impedance of the resistor 1012 is lowered, as demand increases on the driver 105) compared to the driver associated with the first current signal (line 1305), such as the drivers 205, 305, 402.

Figure 14:
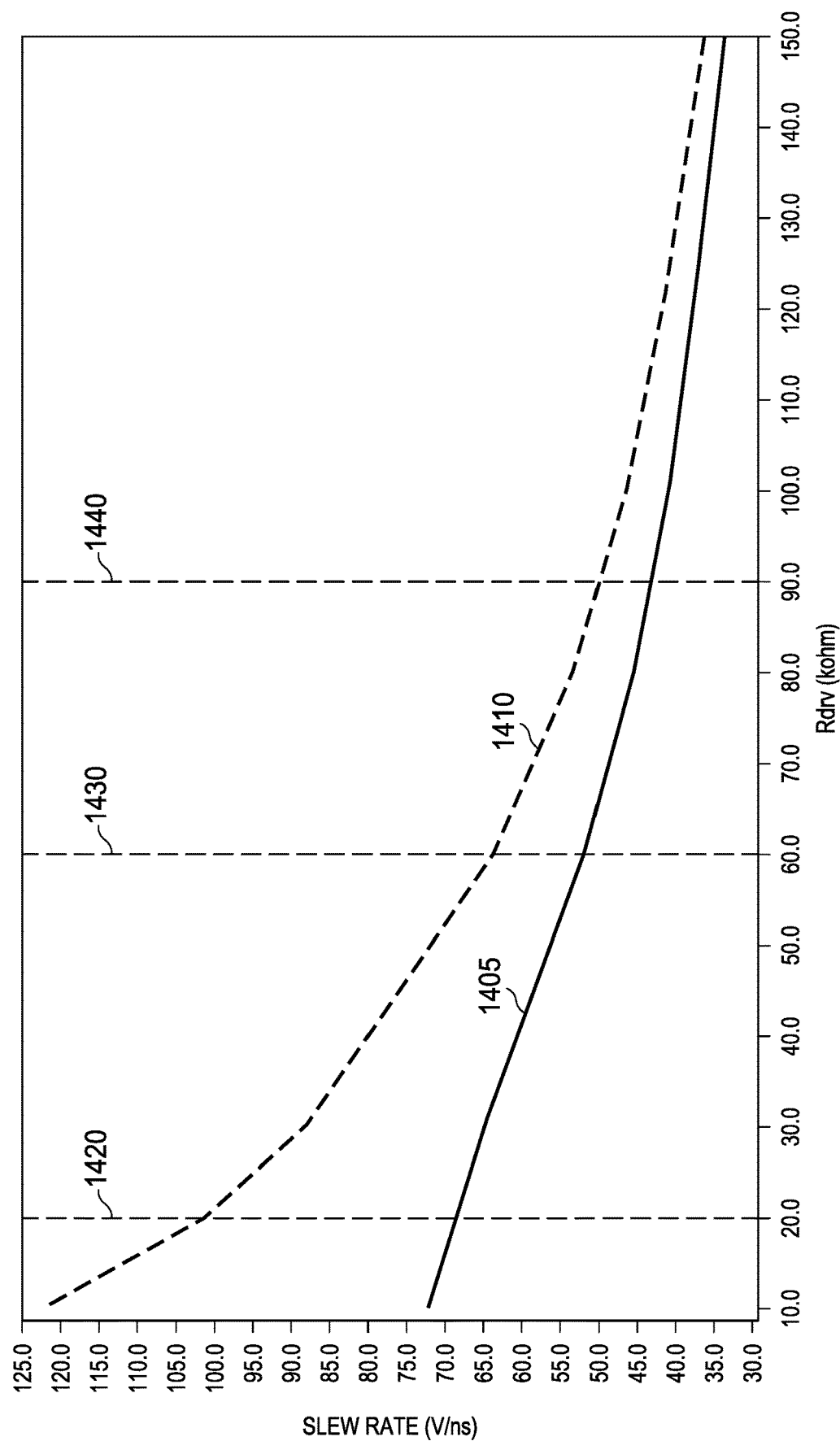
FIG. 14 is a signal plot depicting a first slew rate of a transistor enabled by a first driver and a second slew rate of a transistor enabled by a second driver in a power conversion system at various driver resistances.

FIG. 14 is a signal plot 1400 depicting a first slew rate of a transistor enabled by a first driver and a second slew rate of a transistor enabled by a second driver in a power conversion system at various driver resistances. The signal plot 1400 of FIG. 14 includes a first example slew rate (line 1405) and a second example slew rate (line 1410). In FIG. 14, the first slew rate (line 1405) may represent a slew rate associated with a transistor, such as the change in voltage at the drain terminal 438 of the transistor 404, when the transistor 404 is enabled by the driver 402 of FIG. 4. Further, the first slew rate (line 1205) may represent a slew rate associated with the transistor 210 when enabled by the driver 205 of FIG. 2 and/or the transistor 310 when enabled by the driver 305 of FIG. 3. Similarly, in FIG. 14, the second slew rate (line 1410) may represent a slew rate associated with a transistor, such as the change in voltage at the drain terminal 176 of the transistor 150, when the transistor 150 is enabled by the driver 105 of FIGS. 5, 6, 7A, 7B, and/or 8.

The signal plot 1400 illustrates a slew rate that may be associated with a drain terminal at various impedances (e.g., resistances) of a resistor (Rdrv) coupled to the driver. The resistor (e.g., the resistor 1012 of FIG. 10) may proportionally affect a current provided by a current source (e.g., the current source 632 of FIG. 6) in the driver. For example, the second slew rate (line 1410) may illustrate a change in voltage over time at the drain terminal 176 of the transistor 150 as the transistor is being enabled. In another example, the resistor impedance may be the impedance of the resistor 1012 of FIG. 10, and the resistor 1012 controls the value of the current provided by a current source node (IDRV) included in the driver 1020.

At a first example resistance 1420 of twenty kilohms, the first slew rate (line 1405) is seventy volts per nanosecond, and the second slew rate (line 1410) is 100 volts per nanosecond. At a second example resistance 1430 of 63 kilohms, the first slew rate (line 1405) is 52 volts per nanosecond and the second slew rate (line 1410) is 63 volts per nanosecond. At a third example resistance 1440 of ninety kilohms, the first slew rate (line 1405) is 43 volts per nanosecond, and the second slew rate (line 1410) is 50 volts per nanosecond. Thus, the signal plot 1400 demonstrates that a current applied to the control terminal of the transistor associated with the second slew rate (line 1410) (e.g., the transistor 150) may be greater than a current applied to the control terminal of the transistor associated with the first slew rate (line 1405) with the same resistance (e.g., driver resistance value). Therefore, the driver associated with the second slew rate (line 1410) may enable a larger slew rate for a coupled transistor than the driver associated with the first slew rate (line 1405), such as when the voltage offset of the transistor is zero volts, by providing a larger gate drive current into the transistor. Further, the signal plot 1400 demonstrates that the driver 105 may enable a higher slew rate of the transistor 150 when desired (e.g., when the impedance of the resistor 1012 is lowered, as demand increases on the driver 105) compared to the driver associated with the first slew rate (line 1405), such as the drivers 205, 305, 402.

Figure 15:
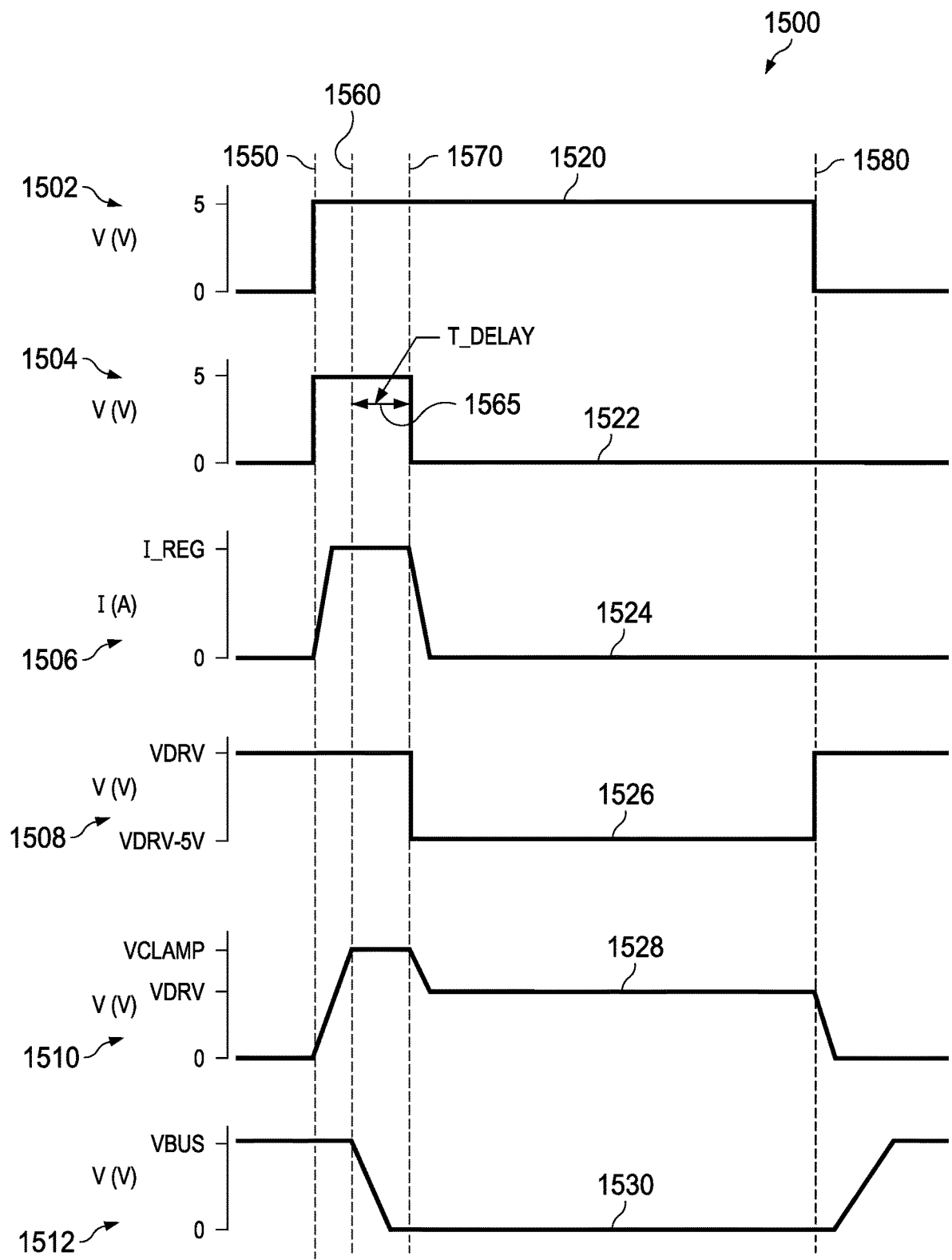
FIG. 15 is a signal plot depicting control signals and output signals of the example power converter of FIG. 1 during operation to drive a transistor.

FIG. 15 is an example signal plot 1500 depicting control signals and output signals of the example power converter 100 of FIG. 1 during operation to drive a transistor, such as the transistor 150 of FIG. 1. The signal plot 1500 of FIG. 15 includes a first depiction 1502, a second depiction 1504, a third depiction 1506, a fourth depiction 1508, a fifth depiction 1510, and a sixth depiction 1512. The first depiction 1502 includes an activation signal (line 1520), which may represent a voltage at the input terminal 156 of the driver 105 of FIGS. 1 and/or 5-8. The second depiction 1504 includes a first trigger signal (line 1522), which may represent a voltage at the first output terminal 524 of the regulator 505. The third depiction 1506 includes a regulation signal (line 1524), which may represent a current provided by the regulator 505 at the second output terminal 526 (e.g., a current through the transistor 604). The fourth depiction 1508 includes a second trigger signal (line 1526), which may represent a voltage at the third output terminal 528 of the regulator.

The fifth depiction 1510 includes an output signal (line 1528), which may represent a voltage at the output terminal 158 of the regulator and/or a voltage at the control terminal 172 of the transistor 150. Moreover, the output signal (line 1528) may represent the first control signal provided by the first stage 510 at the output terminal 534 and/or the second control signal provided by the second stage 515 at the output terminal 538. The sixth depiction 1512 includes a drain signal (line 1530), which may represent a voltage at the drain terminal 176 of the transistor 150. In the example signal plot 1500 of FIG. 15, the magnitude of the voltage or current of any of the signals (lines 1520, 1522, 1524, 1526, 1528, 1530) may be any suitable value.

At a first example time 1550, the controller 120 increases the activation voltage signal (line 1520) to a logic high value of five volts. However, the logic high value may be any suitable magnitude, such as six volts. Responsive to the increase in the activation voltage signal (line 1520), the regulator 505 increases the first trigger signal (line 1522) to five volts. Responsive to the increase in the first trigger signal (line 1522), the first stage 510 provides the first control signal at the output terminal 534, and the output signal at the output terminal 158 increases as a result. Responsive to the voltage of the output signal (line 1528) increasing (e.g., responsive to the voltage signal obtained at the second input terminal 522 increasing), the regulator 505 provides the regulation signal (line 1524) at the second output terminal 526.

At a second example time 1560, the first stage 510 increases the output signal (line 1528) to the voltage of the clamp voltage source node (VCLAMP) 605, and the regulator 505 increases the regulation signal (line 1524) to a value I_REG. Thus, the regulator 505 regulates the first control signal (e.g., the output signal (line 1528)) by providing the regulation signal (line 1524). The regulation signal value I_REG may be any suitable current value, such as one Ampere. Responsive to the output signal (line 1528) at the control terminal 172 exceeding a threshold voltage (e.g., exceeding the voltage of VDRV and/or the voltage of VCLAMP), the transistor 150 transitions into an enabled stage. Thus, the source terminal 174 and the drain terminal 176 are electrically connected, and the drain signal (line 1530) decreases from the value of VBUS. In the example of FIG. 15, the magnitude of VBUS may be any suitable voltage. For example, VBUS may represent the voltage value of the bus voltage node (VIN) 140, or VBUS may represent a voltage of ten volts.

Responsive to the increase in the output signal (line 1528) and, therefore, the increase in the voltage signal obtained at the second input terminal 522, the linear regulator circuit 603 decreases an output signal at the output terminal 620. As a result, the comparator circuit 602 obtains the output signal of the linear regulator circuit 603 at the input terminal 629 and delays for an example period of time (t delay) 1565. The length of the period of time 1565 may be any suitable time period (e.g., ten nanoseconds), and the filter circuit including the resistor 766 and the capacitor 768 controls the length of the period of time 1565. In the example of FIG. 15, the drain signal (line 1530) decreases to zero volts during the period of time 1565. However, the drain signal (line 1530) may decrease to any suitable voltage, such as one volt. Further, the drain signal (line 1530) may decrease to a suitable voltage (e.g., zero volts, one volt) before or after the period of time 1565.

After the period of time 1565 controlled by the comparator circuit 602 (e.g., controlled by the resistor 766 and the capacitor 768), and at a third example time 1570, the regulator 505 decreases the first trigger signal (line 1522) and the regulation signal (line 1524) each to zero volts, and the regulator 505 decreases the second trigger signal (line 1526) to a value of VDRV-5V. In some examples, the voltage of the second voltage source node (VDRV) 518 may be six volts, and the value of VDRV-5V may therefore be one volt. Responsive to the decrease in the first trigger signal (line 1522), the first stage 510 decreases (e.g., ceases to provide) the first control signal at the output terminal 534, and responsive to the decrease in the second trigger signal (line 1526), the second stage 515 increases the second control signal at the output terminal 538. As a result, the output signal (line 1528) at the output terminal 158 and at the control terminal 172 of the transistor 150 decreases from the voltage of the clamp voltage source node (VCLAMP) 605 to the voltage of the second voltage source node (VDRV) 518. As a result of the decrease in the output signal (line 1528), the transistor 150 is enabled, and, thus, the drain signal (line 1530) remains at zero volts.

At a fourth example time 1580, the controller 120 decreases the activation signal (IN) (line 1520) to zero volts. Responsive to the decrease in the activation signal (line 1520), the regulator 505 increases the second trigger signal (line 1526) to the voltage of VDRV. As a result, the second stage 515 decreases the second control signal, and, thus the output signal (line 1528) decreases to zero volts. As a result, the transistor 150 is disabled, and the drain signal (line 1530) increases to the voltage of VBUS.

Example methods, apparatus, systems, and articles of manufacture to drive a transistor are disclosed herein. Further examples and combinations thereof include the following:

Example 1 includes an apparatus comprising a regulator including a first input terminal adapted to be coupled to a control terminal of a transistor, a first output terminal, and a second output terminal, a first stage including a first input terminal coupled to the first output terminal of the regulator and an output terminal adapted to be coupled to the control terminal of the transistor, and a second stage including an input terminal coupled to the second output terminal of the regulator, and an output terminal adapted to be coupled to the control terminal of the transistor.

Example 2 includes the apparatus of example 1, wherein the regulator includes a second input terminal and a logic gate including a first input terminal coupled to the second input terminal of the regulator, a second input terminal coupled to a comparator circuit, and an output terminal coupled to the first output terminal of the regulator.

Example 3 includes the apparatus of example 1, wherein the regulator includes a comparator circuit including an input terminal coupled to a linear regulator circuit, a first output terminal coupled to the second output terminal of the regulator, and a second output terminal coupled to a logic gate.

Example 4 includes the apparatus of example 1, wherein the transistor is a first transistor, and the regulator includes a third output terminal, a linear regulator circuit including an output terminal, a first input terminal adapted to be coupled to a voltage source, a second input terminal coupled to the first input terminal of the regulator, and a second transistor including a control terminal coupled to the output terminal of the linear regulator circuit, a first current terminal adapted to be coupled to a voltage source, and a second current terminal coupled to the third output terminal of the regulator.

Example 5 includes the apparatus of example 4, wherein the first stage includes a second input terminal coupled to the third output terminal of the regulator.

Example 6 includes the apparatus of example 4, wherein the linear regulator circuit includes a second transistor including a control terminal, a first current terminal coupled to the first input terminal of the linear regulator circuit, and a second current terminal coupled to the control terminal of the second transistor, a third transistor including a control terminal coupled to the control terminal of the second transistor and adapted to be coupled to a ground node, a first current terminal coupled to the second input terminal of the linear regulator circuit, and a second current terminal, and a fourth transistor including a control terminal coupled to the second current terminal of the third transistor and adapted to be coupled to the ground node, a first current terminal adapted to be coupled to the ground node, and a second current terminal coupled to the output terminal of the linear regulator circuit.

Example 7 includes the apparatus of example 4, wherein the linear regulator circuit includes a second transistor including a control terminal coupled to the second input terminal of the linear regulator circuit, a first current terminal coupled to the first input terminal of the linear regulator circuit, and a second current terminal coupled to the output terminal of the linear regulator circuit.

Example 8 includes the apparatus of example 1, wherein the transistor is a first transistor, and the first stage includes a switching circuit including a first terminal coupled to the input terminal of the first stage, a second terminal adapted to be coupled to a current source, and a third terminal, and a first current mirror circuit adapted to be coupled to a voltage source node, the first current mirror circuit including a first terminal coupled to the third terminal of the switching circuit and a second terminal coupled to the output terminal of the first stage.

Example 9 includes the apparatus of example 8, wherein the first stage includes a second current mirror circuit coupled between the second terminal of the first current mirror circuit and the control terminal of the first transistor, the second current mirror circuit including a first terminal coupled to the second terminal of the first current mirror circuit and a second terminal adapted to be coupled to the control terminal of the first transistor.

Example 10 includes the apparatus of example 9, wherein the second current mirror circuit includes a third transistor including a control terminal coupled to the first terminal of the second current mirror circuit, a first current terminal coupled to the second terminal of the second current mirror circuit, and a second current terminal coupled to the first terminal of the second current mirror circuit, and a fourth transistor including a control terminal coupled to the control terminal of the third transistor, a first current terminal coupled to the second terminal of the second current mirror circuit, and a second current terminal adapted to be coupled to the voltage source node.

Example 11 includes the apparatus of example 8, wherein the current mirror circuit includes a third transistor including a control terminal coupled to the first terminal of the current mirror circuit, a first current terminal adapted to be coupled to the voltage source node, and a second current terminal coupled to the first terminal of the current mirror circuit, and a fourth transistor including a control terminal coupled to the control terminal of the third transistor, a first current terminal adapted to be coupled to the voltage source node, and a second current terminal coupled to the second terminal of the current mirror circuit.

Example 12 includes the apparatus of example 8, wherein the switching circuit includes a third transistor, the first terminal of the switching circuit is coupled to the first output terminal of the regulator, the second terminal of the switching circuit is coupled to a first current terminal of the third transistor, and the third terminal of the switching circuit is coupled to a second current terminal of the third transistor.

Example 13 includes the apparatus of example 1, wherein the transistor is a first transistor, and the second stage includes a second transistor including a control terminal coupled to the input terminal of the second stage, a first current terminal adapted to be coupled to a voltage source node, and a second current terminal coupled to the output terminal of the second stage.

Example 14 includes an apparatus comprising a first stage including an input terminal and an output terminal adapted to be coupled to a control terminal of a transistor, the first stage adapted to enable the transistor with a first voltage from a first voltage source, a second stage including an input terminal and an output terminal adapted to be coupled to the control terminal of the transistor, the second stage adapted to enable the transistor with a second voltage from a second voltage source, the first voltage has a greater potential than the second voltage, and a regulator including a first input terminal adapted to be coupled to the control terminal of the transistor, a second input terminal, a first output terminal coupled to the input terminal of the first stage, and a second output terminal coupled to the input terminal of the second stage, the regulator adapted to enable the first stage based on an activation signal obtained at the second input terminal of the regulator exceeding a first threshold voltage level, and enable the second stage based on a voltage signal at the first input terminal of the regulator exceeding a second threshold voltage level for a period of time.

Example 15 includes the apparatus of example 14, wherein the regulator includes a third output terminal, and the regulator is adapted to regulate a voltage at the first input terminal by providing a regulation signal at the third output terminal of the regulator.

Example 16 includes the apparatus of example 14, wherein the regulator is adapted to enable the first stage by providing a first trigger signal at the first output terminal of the regulator.

Example 17 includes the apparatus of example 16, wherein the first stage is adapted to enable the transistor by providing a first control signal at the output terminal of the first stage based on the first trigger signal exceeding a third threshold voltage level.

Example 18 includes the apparatus of example 14, wherein the regulator is adapted to be coupled to a clamp voltage source, and the regulator is adapted to disable the first stage based on a voltage signal at the first input terminal exceeding a voltage of the clamp voltage source.

Example 19 includes the apparatus of example 14, wherein the regulator is adapted to enable the second stage by providing a second trigger signal at the second output terminal of the regulator.

Example 20 includes the apparatus of example 19, wherein the second stage is adapted to enable the transistor by providing a second control signal at the output terminal of the second stage based on the second trigger signal exceeding a third threshold voltage level.

Example 21 includes the apparatus of example 14, wherein the transistor is a first transistor, and the first stage includes a switching circuit including a first terminal coupled to the first input terminal of the first stage, a second terminal adapted to be coupled to a current source, and a third terminal, the switching circuit adapted to, based on a first trigger signal exceeding a third threshold voltage level, provide a mirror signal at the third terminal of the switching circuit.

Example 22 includes the apparatus of example 21, wherein the transistor is a first transistor, and the first stage includes a current mirror circuit adapted to be coupled to a voltage source node, the current mirror circuit including a first terminal coupled to the third terminal of the switching circuit and a second terminal coupled to the output terminal of the first stage, the current mirror circuit adapted to provide a first control signal at the second terminal of the current mirror circuit based on the mirror signal.

Example 23 includes the apparatus of example 14, wherein the regulator is adapted to output a first trigger signal at the first output terminal in response to the activation signal exceeding the first threshold voltage level, and in response to the voltage signal exceeding the second threshold voltage level for the period of time, output a second trigger signal at the second output terminal.

Example 24 includes a system comprising a driver including an input terminal adapted to receive an activation signal and an output terminal, and a transistor including a control terminal coupled to the output terminal of the driver, the driver adapted to output a first control signal to the control terminal of the transistor, the first control signal having a first voltage, output a second control signal to the control terminal of the transistor, the second control signal having a second voltage, and wherein the first voltage has a greater potential than the second voltage.

Example 25 includes the system of example 24, wherein the driver includes a regulator including a first input terminal coupled to the input terminal of the driver, a second input terminal coupled to the control terminal of the transistor, a first output terminal, and a second output terminal, the regulator adapted to output a first trigger signal at the first output terminal of the regulator based on the activation signal obtained at the first input terminal of the regulator exceeding a first threshold voltage level, and output a second trigger signal at the second output terminal of the regulator based on a voltage signal obtained at the second input terminal of the regulator exceeding a second threshold voltage level.

Example 26 includes the system of example 25, wherein the regulator includes a third output terminal, and the regulator is adapted to regulate a voltage at the input terminal of the regulator by providing a regulation signal at the third output terminal of the regulator.

Example 27 includes the system of example 24, wherein the driver includes a first stage including an input terminal and an output terminal coupled to the control terminal of the transistor, the first stage adapted to output the first control signal at the output terminal of the first stage based on a trigger signal obtained at the input terminal of the first stage exceeding a threshold voltage level.

Example 28 includes the system of example 24, wherein the driver includes a second stage including an input terminal and an output terminal coupled to the control terminal of the transistor, the second stage adapted to output the second control signal at the output terminal of the second stage based on a trigger signal obtained at the input terminal of the second stage exceeding a threshold voltage level.

From the foregoing, it will be appreciated that example methods, apparatus, and articles of manufacture have been disclosed that drive a transistor. The disclosed methods, apparatus, and articles of manufacture improve the efficiency of using a computing device by the enabling the ability of a driver in a power conversion system to drive a transistor gate from an off-state into an on-state with a signal higher than the on-state gate signal. The disclosed methods, apparatus, and articles of manufacture are accordingly directed to one or more improvement(s) in the functioning of a computer.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent. The following claims are hereby incorporated into this Detailed Description by this reference, with each claim standing on its own as a separate embodiment of the present disclosure.

What is claimed is:

1. An apparatus comprising:
a regulator including a first input terminal adapted to be coupled to a control terminal of a first transistor, a first output terminal, and a second output terminal, the regulator including:
a third output terminal;
a linear regulator circuit including an output terminal, a first input terminal adapted to be coupled to a voltage source, a second input terminal coupled to the first input terminal of the regulator; and
a second transistor including a control terminal coupled to the output terminal of the linear regulator circuit, a first current terminal adapted to be coupled to a voltage source, and a second current terminal coupled to the third output terminal of the regulator;
a first stage including a first input terminal coupled to the first output terminal of the regulator and an output terminal adapted to be coupled to the control terminal of the transistor; and a second stage including an input terminal coupled to the second output terminal of the regulator, and an output terminal adapted to be coupled to the control terminal of the transistor.

2. The apparatus of claim 1, wherein the first stage includes a second input terminal coupled to the third output terminal of the regulator.

3. The apparatus of claim 1, wherein the linear regulator circuit includes:
a second transistor including a control terminal, a first current terminal coupled to the first input terminal of the linear regulator circuit, and a second current terminal coupled to the control terminal of the second transistor;
a third transistor including a control terminal coupled to the control terminal of the second transistor and adapted to be coupled to a ground node, a first current terminal coupled to the second input terminal of the linear regulator circuit, and a second current terminal; and
a fourth transistor including a control terminal coupled to the second current terminal of the third transistor and adapted to be coupled to the ground node, a first current terminal adapted to be coupled to the ground node, and a second current terminal coupled to the output terminal of the linear regulator circuit.

4. The apparatus of claim 1, wherein the linear regulator circuit includes:
a second transistor including a control terminal coupled to the second input terminal of the linear regulator circuit, a first current terminal coupled to the first input terminal of the linear regulator circuit, and a second current terminal coupled to the output terminal of the linear regulator circuit.

5. A power converter operable to provide power to a load, the power converter comprising:
a first transistor having a first control terminal, a first current terminal and a second current terminal, the first current terminal coupled to a voltage supply;
a second transistor having a second control terminal, a third current terminal and a fourth current terminal, the third current terminal coupled to the second current terminal and the fourth current terminal coupled to ground; and
a driver having an output coupled to the second control terminal, the driver operable to:
provide, during a first state of operation, a first voltage to the second control terminal to cause the second transistor to be in an off-state;
provide, during a second state of operation after the first state of operation, a second voltage to the second control terminal to cause the second transistor to be in an on-state, the second voltage exceeding the maximum-rated voltage for the second transistor; and
provide, during a third state of operation after the second state of operation, a third voltage to the second control terminal to cause the second transistor to be in an on-state, the third voltage being less than the maximum-rated voltage for the second transistor.

6. The power converter of claim 5, wherein the first transistor is a GaN transistor.

7. The power converter of claim 5, wherein the second transistor is a GaN transistor.

* * * * *